US012586660B2

(12) United States Patent
Jin

(10) Patent No.: US 12,586,660 B2
(45) Date of Patent: Mar. 24, 2026

(54) MEMORY DEVICE AND OPERATION METHOD THEREOF, MEMORY SYSTEM, AND COMPUTER SYSTEM

(71) Applicant: YANGTZE MEMORY TECHNOLOGIES CO., LTD., Wuhan (CN)

(72) Inventor: Chong Jin, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 111 days.

(21) Appl. No.: 18/612,859

(22) Filed: Mar. 21, 2024

(65) Prior Publication Data

US 2025/0157567 A1     May 15, 2025

(30) Foreign Application Priority Data

Nov. 14, 2023     (CN) .......................... 202311527958.1

(51) Int. Cl.
*G11C 29/00*          (2006.01)
*G11C 8/08*           (2006.01)
(52) U.S. Cl.
CPC .............. *G11C 29/785* (2013.01); *G11C 8/08* (2013.01); *G11C 29/76* (2013.01)
(58) Field of Classification Search
CPC .............................. G11C 29/785; G11C 29/78
USPC .................................................... 365/185.09
See application file for complete search history.

(56) References Cited

U.S. PATENT DOCUMENTS 5,426,607 A * 6/1995 Ishibashi .............. G11C 29/846
                                               365/230.03
5,633,826 A * 5/1997 Tsukada ................. G11C 29/24
                                               365/201
6,411,557 B2 * 6/2002 Terzioglu ................. G11C 7/06
                                               365/225.7
2019/0371424 A1 * 12/2019 Mathur ................ G11C 29/789

* cited by examiner

*Primary Examiner* — Muna A Techane
(74) *Attorney, Agent, or Firm* — Conley Rose, P.C.

(57) ABSTRACT

Examples of the present application disclose a memory device, an operation method, a memory system, and a computer system. The memory device includes: a memory array including a first sub-array and a second sub-array, wherein the first sub-array includes a plurality of first memory cell rows, and the second sub-array includes a plurality of second memory cell rows; and a peripheral circuit comprising: a plurality of redundant control switch components coupled to the plurality of second memory cell rows one-to-one; and a word line drive component coupled to each of the plurality of redundant control switch components, wherein each redundant control switch component is configured to: in response to a first redundant selection signal, be in an on state and transmit a corresponding redundant control signal to a corresponding word line drive component; and the corresponding word line drive component is configured to: in response to the redundant control signal, drive a second memory cell row of the plurality of second memory cell rows that is configured to replace the first memory cell row indicated by the input address information.

20 Claims, 14 Drawing Sheets

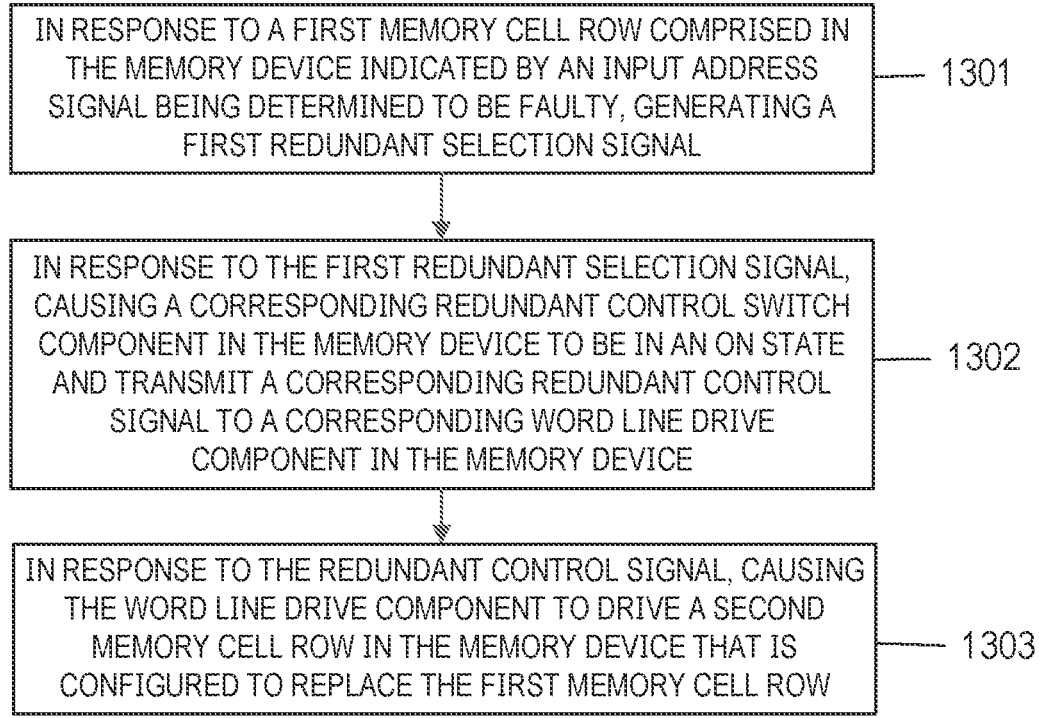

IN RESPONSE TO A FIRST MEMORY CELL ROW COMPRISED IN THE MEMORY DEVICE INDICATED BY AN INPUT ADDRESS SIGNAL BEING DETERMINED TO BE FAULTY, GENERATING A FIRST REDUNDANT SELECTION SIGNAL — 1301

IN RESPONSE TO THE FIRST REDUNDANT SELECTION SIGNAL, CAUSING A CORRESPONDING REDUNDANT CONTROL SWITCH COMPONENT IN THE MEMORY DEVICE TO BE IN AN ON STATE AND TRANSMIT A CORRESPONDING REDUNDANT CONTROL SIGNAL TO A CORRESPONDING WORD LINE DRIVE COMPONENT IN THE MEMORY DEVICE — 1302

IN RESPONSE TO THE REDUNDANT CONTROL SIGNAL, CAUSING THE WORD LINE DRIVE COMPONENT TO DRIVE A SECOND MEMORY CELL ROW IN THE MEMORY DEVICE THAT IS CONFIGURED TO REPLACE THE FIRST MEMORY CELL ROW — 1303

FIG. 13

MEMORY DEVICE AND OPERATION METHOD THEREOF, MEMORY SYSTEM, AND COMPUTER SYSTEM

CROSS-REFERENCE TO RELATED APPLICATIONS

The present application claims priority to Chinese Patent Application No. 2023115279581, which was filed Nov. 14, 2023, is titled "MEMORY DEVICE, OPERATING METHOD, MEMORY SYSTEM AND COMPUTER SYSTEM," and is hereby incorporated herein by reference in its entirety.

TECHNICAL FIELD

The present application relates to the technical field of memory technology, and particularly to a memory device, an operation method, a memory system, and a computer system.

BACKGROUND

In a memory system, a memory device comprises redundant memory cell rows that are designated to replace defective memory cell rows. During an actual operation process, a relatively longer time is required to select the redundant memory cell rows to store data.

SUMMARY

In view of this, examples of the present application provide a memory device, an operation method, a memory system, and a computer system.

In order to achieve the above purpose, the technical solution of the present application is implemented as follows:

In a first aspect, examples of the present application provide a memory device, comprising:

a memory array comprising a first sub-array and a second sub-array, wherein the first sub-array comprises a plurality of first memory cell rows, and the second sub-array comprises a plurality of second memory cell rows; and a peripheral circuit coupled to the plurality of first memory cell rows and the plurality of second memory cell rows and comprising: a plurality of redundant control switch components coupled to the plurality of second memory cell rows one-to-one; and a word line drive component coupled to each of the plurality of redundant control switch components, wherein each of the redundant control switch components is configured to: in response to a first redundant selection signal, be in an on state and transmit a corresponding redundant control signal to a corresponding word line drive component, wherein the first redundant selection signal is generated when a first memory cell row indicated by input address information is determined to be faulty; and the corresponding word line drive component is configured to: in response to the redundant control signal, drive a second memory cell row of the plurality of second memory cell rows that is configured to replace the first memory cell row indicated by the input address information.

In the above solution, each of the redundant control switch components is further configured to: in response to a second redundant selection signal, be in an off state and inhibit transmitting the redundant control signal to the corresponding word line drive component, wherein the second redundant selection signal is generated when the first memory cell row indicated by the input address information is determined to be fault-free.

In the above solution, the peripheral circuit further comprises an inverting component coupled to each of the plurality of redundant control switch components, wherein each inverting component is configured to: output a first inverting signal in response to the first redundant selection signal; or output a second inverting signal in response to the second redundant selection signal; and the each of the redundant control switch components is further configured to: be in the on state in response to the first redundant selection signal and the first inverting signal; or be in the off state in response to the second redundant selection signal and the second inverting signal.

In the above solution, the redundant control signal comprises a plurality of bits, and the redundant control switch component comprises: a plurality of switch circuits corresponding to the plurality of bits one-to-one, wherein each of the plurality of switch circuits is of the same type, wherein each of the plurality of switch circuits is configured to: in response to the first redundant selection signal, be in the on state and transmit a corresponding bit in the redundant control signal to the corresponding word line drive component; or in response to the second redundant selection signal, be in the off state and inhibit transmitting the corresponding bit in the redundant control signal to the corresponding word line drive component.

In the above solution, the switch circuit comprises: an N-type metal oxide semiconductor NMOS transistor or a P-type metal oxide semiconductor PMOS transistor.

In the above solution, the redundant control signal comprises a plurality of bits, and the redundant control switch component comprises: a plurality of switch circuits corresponding to the plurality of bits one-to-one, wherein the plurality of switch circuits comprise two types of switch circuits, and wherein a first type of switch circuit of the plurality of switch circuits is configured to: in response to the first redundant selection signal, be in the on state and transmit a corresponding bit of the plurality of bits; and a second type of switch circuit of the plurality of switch circuits is configured to: in response to the first inverting signal, be in the on state and transmit the corresponding bit of the plurality of bits.

In the above solution, the first type of switch circuit is further configured to: in response to the second redundant selection signal, be in the off state and inhibit transmitting the corresponding bit of the plurality of bits, and the second type of switch circuit is further configured to: in response to the second inverting signal, inhibit transmitting the corresponding bit of the plurality of bits.

In the above solution, the first type of switch circuit comprises an NMOS transistor, and the second type of switch circuit comprises a PMOS transistor; or the first type of switch circuit comprises a PMOS transistor, and the second type of switch circuit comprises an NMOS transistor.

In the above solution, the peripheral circuit further comprises: a plurality of redundant selection components corresponding to the plurality of redundant control switch components one-to-one, wherein

3 each of the redundant selection components is configured to: receive the input address information; compare the input address information with preset address information; output the first redundant selection signal in response to a comparison result indicating that the preset address information is the same as the input address information; and output the second redundant selection signal in response to the comparison result indicating that the preset address information is different from the input address information, wherein the preset address information comprises any one of address information corresponding to the plurality of second memory cell rows.

In the above solution, the redundant selection component comprises a content addressable memory CAM configured to store the preset address information; and the CAM is further configured to: receive the input address information; compare each bit in the input address information with each bit of the preset address information; output the first redundant selection signal in response to each bit in the input address information being the same as each bit of the preset address information; and output the second redundant selection signal in response to the input address information and the preset address information having bits that are different.

In the above solution, the peripheral circuit further comprises: a first transmission bus coupled to the plurality of redundant control switch components and the plurality of word line drive components respectively and configured to: receive the redundant control signal transmitted by the redundant control switch component in the on state and transmit the redundant control signal to the corresponding word line drive component.

In the above solution, the peripheral circuit further comprises: a second transmission bus coupled to the plurality of redundant selection components and configured to: receive the input address information and transmit the input address information to each of the redundant selection components.

In a second aspect, examples of the present application provide an operation method of a memory device, comprising:

in response to a first memory cell row comprised in the memory device indicated by an input address signal being determined to be faulty, generating a first redundant selection signal;

in response to the first redundant selection signal, causing a corresponding redundant control switch component in the memory device to be in an on state and transmit a corresponding redundant control signal to a corresponding word line drive component in the memory device; and in response to the redundant control signal, causing the word line drive component to drive a second memory cell row in the memory device that is configured to replace the first memory cell row.

In the above solution, the method further comprises:

in response to the first memory cell row being determined to be fault-free, generating a second redundant selection signal; and in response to the second redundant selection signal, causing the corresponding redundant control switch component in the memory device to be in an off state and inhibit transmitting the corresponding redundant control signal to the corresponding word line drive component in the memory device, wherein the second redundant selection signal is generated when the first memory cell row indicated by the input address information is determined to be fault-free.

In the above solution, the method further comprises:

generating a first inverting signal in response to the first redundant selection signal; and in response to the first redundant selection signal and the first inverting signal, causing the corresponding redundant control switch component in the memory device to be in the on state and transmit the corresponding redundant control signal to the corresponding word line drive component in the memory device;

or generating a second inverting signal in response to the second redundant selection signal; and in response to the second redundant selection signal and the second inverting signal, causing the corresponding redundant control switch component in the memory device to be in the off state and inhibit transmitting the corresponding redundant control signal to the corresponding word line drive component in the memory device.

In the above solution, the method further comprises:

comparing the input address information with preset address information;

generating the first redundant selection signal in response to a comparison result indicating that the preset address information is the same as the input address information; and generating the second redundant selection signal in response to the comparison result indicating that the preset address information is different from the input address information, wherein the preset address information comprises any one of address information corresponding to a plurality of second memory cell rows, and each of the plurality of second memory cell rows is configured to perform redundant replacement on the first memory cell row that is faulty.

In the above solution, the comparing the input address information with preset address information comprises:

comparing each bit in the input address information with each bit of the preset address information, wherein the first redundant selection signal is generated in response to each bit in the input address information being the same as each bit of the preset address information, and the second redundant selection signal is generated in response to the input address information and the preset address information having bits that are different.

In the above solution, the redundant control signal is obtained according to a decoding table comprising a mapping relationship between a redundant replacement scheme stored in the memory device and the redundant control signal, and the redundant replacement scheme comprises indication information indicating the second memory cell row which is configured to replace the first memory cell row that is faulty.

In a third aspect, examples of the present application further provide a memory system, comprising: at least one memory device, and a memory controller coupled to the memory device and configured to control the memory device.

In a fourth aspect, examples of the present application further provide computer system, comprising the above-mentioned memory system, and a graphics processing unit coupled to the memory system and configured to control the memory system.

The examples of the present application provide a memory device, an operation method, a memory system, and a computer system. The memory device comprises: a memory array comprising a first sub-array and a second sub-array, wherein the first sub-array comprises a plurality of first memory cell rows, and the second sub-array comprises a plurality of second memory cell rows; and a peripheral circuit coupled to the plurality of first memory cell rows and the plurality of second memory cell rows and comprising: a plurality of redundant control switch components coupled to the plurality of second memory cell rows one-to-one; and a word line drive component coupled to each of the plurality of redundant control switch components, wherein each of the redundant control switch components is configured to: in response to a first redundant selection signal, be in an on state and transmit a corresponding redundant control signal to a corresponding word line drive component, wherein the first redundant selection signal is generated when a first memory cell row indicated by input address information is determined to be faulty; and the corresponding word line drive component is configured to: in response to the redundant control signal, drive a second memory cell row of the plurality of second memory cell rows that is configured to replace the first memory cell row indicated by the input address information. In the memory device provided by the examples of the present application, by configuring the redundant control switch component, the redundant control signal is controlled to be directly transmitted to the redundant second memory cell row to drive the second memory cell row for storing or reading data, such that the transmission speed of the redundant control signal can be greatly increased to accelerate the overall speed of the memory device.

BRIEF DESCRIPTION OF THE DRAWINGS

In the drawings not necessarily drawn to scale, like reference numerals may describe similar components in different views. Like reference numerals having different letter suffixes may represent different instances of similar components. The drawings illustrate generally, by way of example, but not by way of limitation, various examples discussed in the present document.

6

Figure 7:
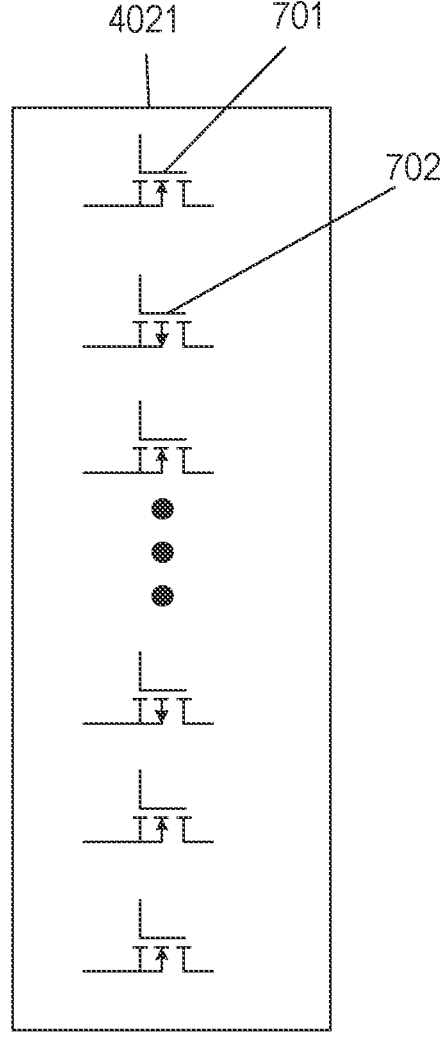
FIG. 7 is another schematic structural diagram of an example redundant control switch component provided by an example of the present application.
Figure 9:
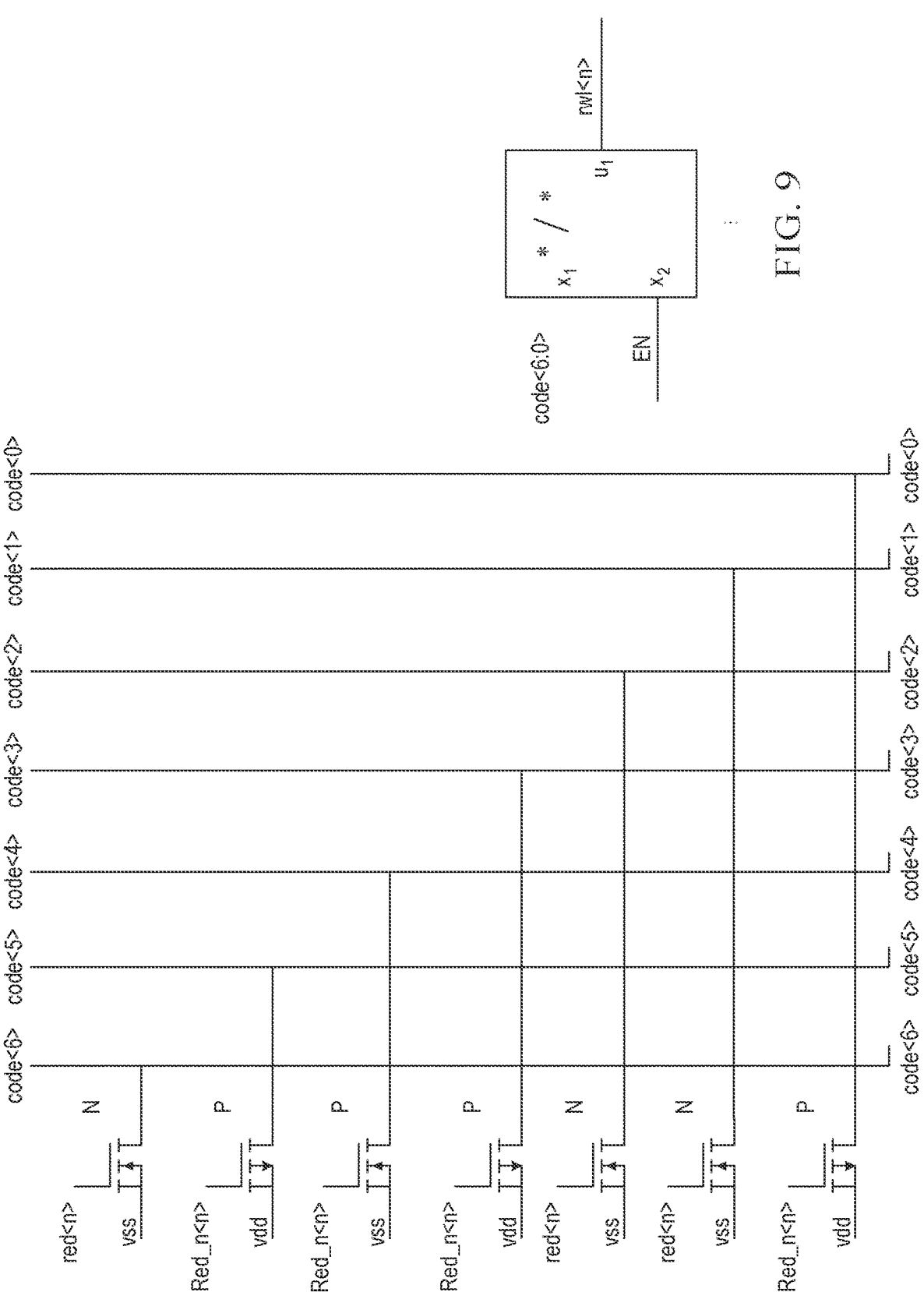
Figure 10:
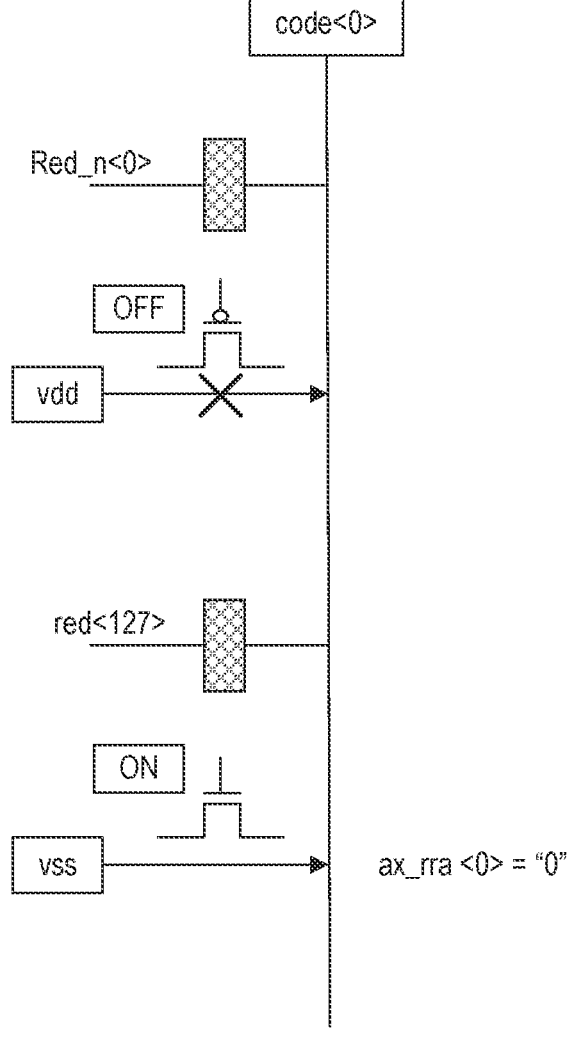
Figure 11:
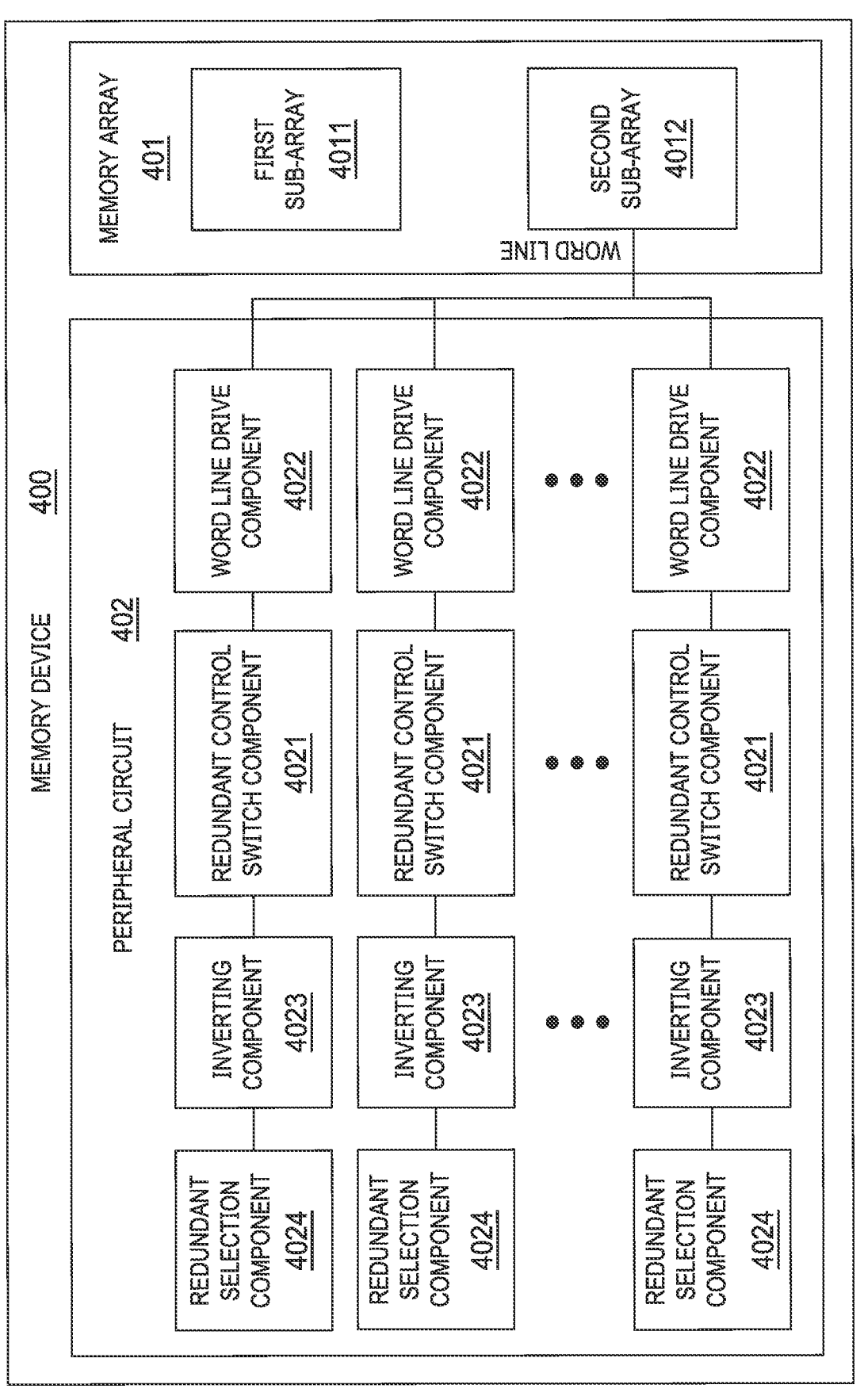
Figure 12:
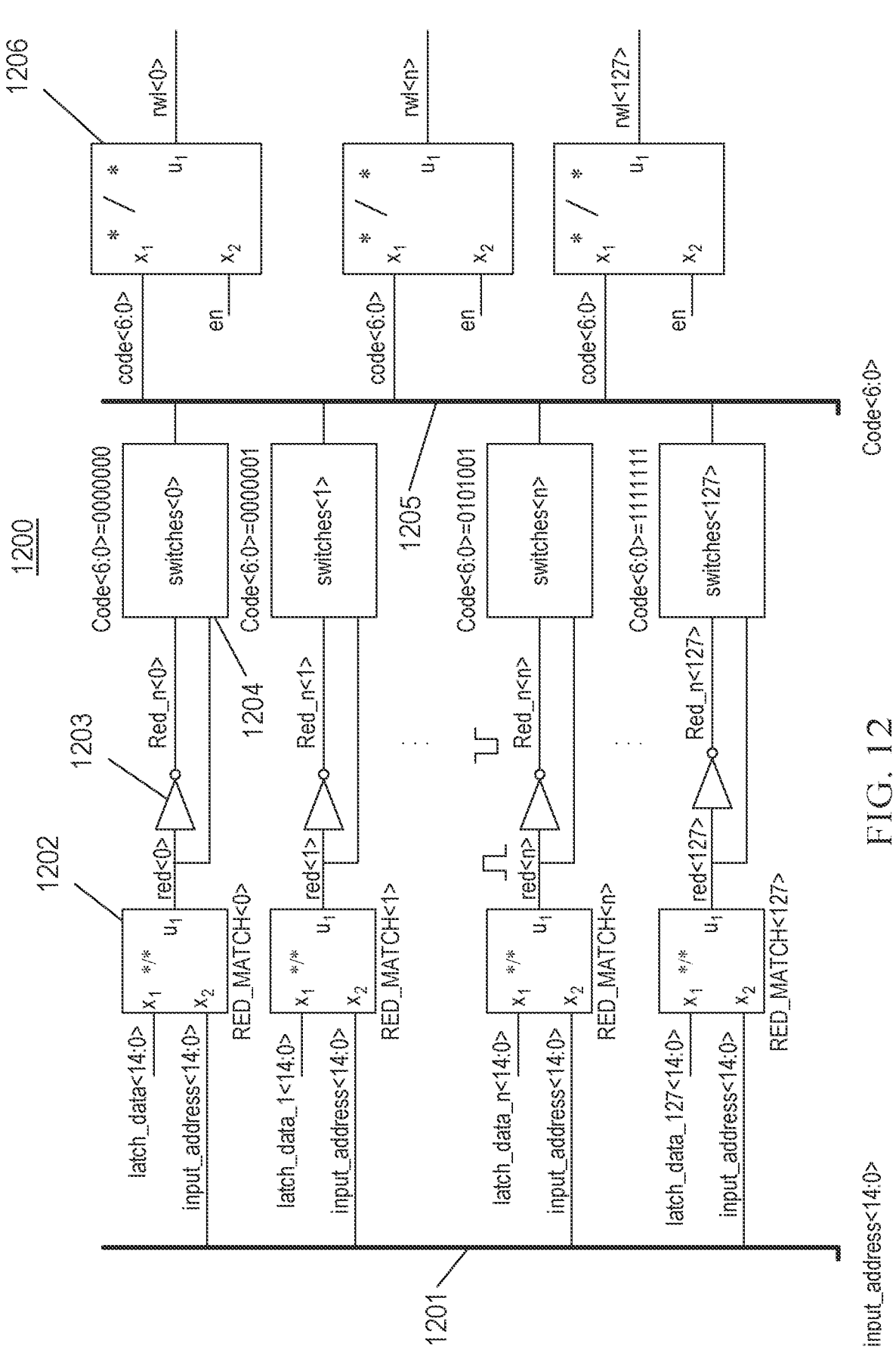
Figure 14:
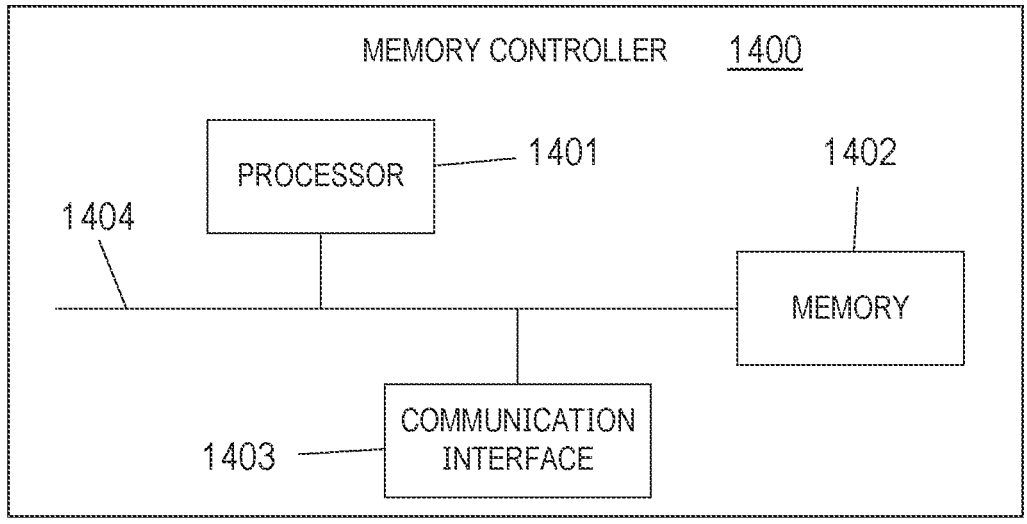

FIG. 9 is a flow diagram of another operation method of a memory device for the redundant control switch component shown in FIG. 7 provided by an example of the present application;

FIG. 10 is a schematic diagram of transmission of a redundant control signal provided by an example of the present application;

FIG. 11 is a fourth block diagram of an example memory device provided by an example of the present application;

FIG. 12 is a fifth block diagram of an example memory device provided by an example of the present application;

FIG. 13 is a flow diagram of an operation method of a memory device provided by an example of the present application; and FIG. 14 is an example schematic structural diagram of a memory controller provided by an example of the present application.

DETAILED DESCRIPTION

Examples of the present application will be described in more detail below with reference to the accompanying drawings. Although examples of the present application are shown in the drawings, it should be understood that the present application may be implemented in various ways and should not be limited to the DETAILED DESCRIPTION set forth herein. Rather, these examples are provided so that the present application can be more thoroughly understood and the scope of the present application can be fully conveyed to those skilled in the art.

In the following description, numerous specific details are given in order to provide a more thorough understanding of the present application. It will be apparent, however, to one skilled in the art that the present application may be practiced without one or more of these details. In other examples, some technical features well-known in the art are not described to avoid confusion with the present disclosure; that is, not all features of the actual example are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to" or "coupled to" other elements or layers, it can be directly on, adjacent to, connected to, or coupled to other elements or layers, or intervening elements or layers may be present. In contrast, when an element is referred to as being "directly on," "directly adjacent to," "directly connected to" or "directly coupled to" other elements or layers, there are no intervening elements or layers. It will be understood that, although the terms such as first, second, third etc. May be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present application. When a second element, component, region, layer or section is discussed, it does not indicate that a first element, component, region, layer or section exists in the present application.

Spatial relationship terms such as "under", "below", "beneath", "underneath", "on", "above" and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present application. As used herein, "a", "an" and "said/the" in singular forms are intended to include the plural forms as well, unless the context clearly dictates otherwise. It should also be understood that at least one of the terms "consists of" or "comprising", when used in this specification, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

In order to be able to understand the characteristics and the technical contents of the examples of the present application in more detail, implementation of the examples of the present application is set forth in detail below in conjunction with the drawings, and the appended drawings are only used for reference and illustration, instead of being used to limit the examples of the present application.

Figure 1:
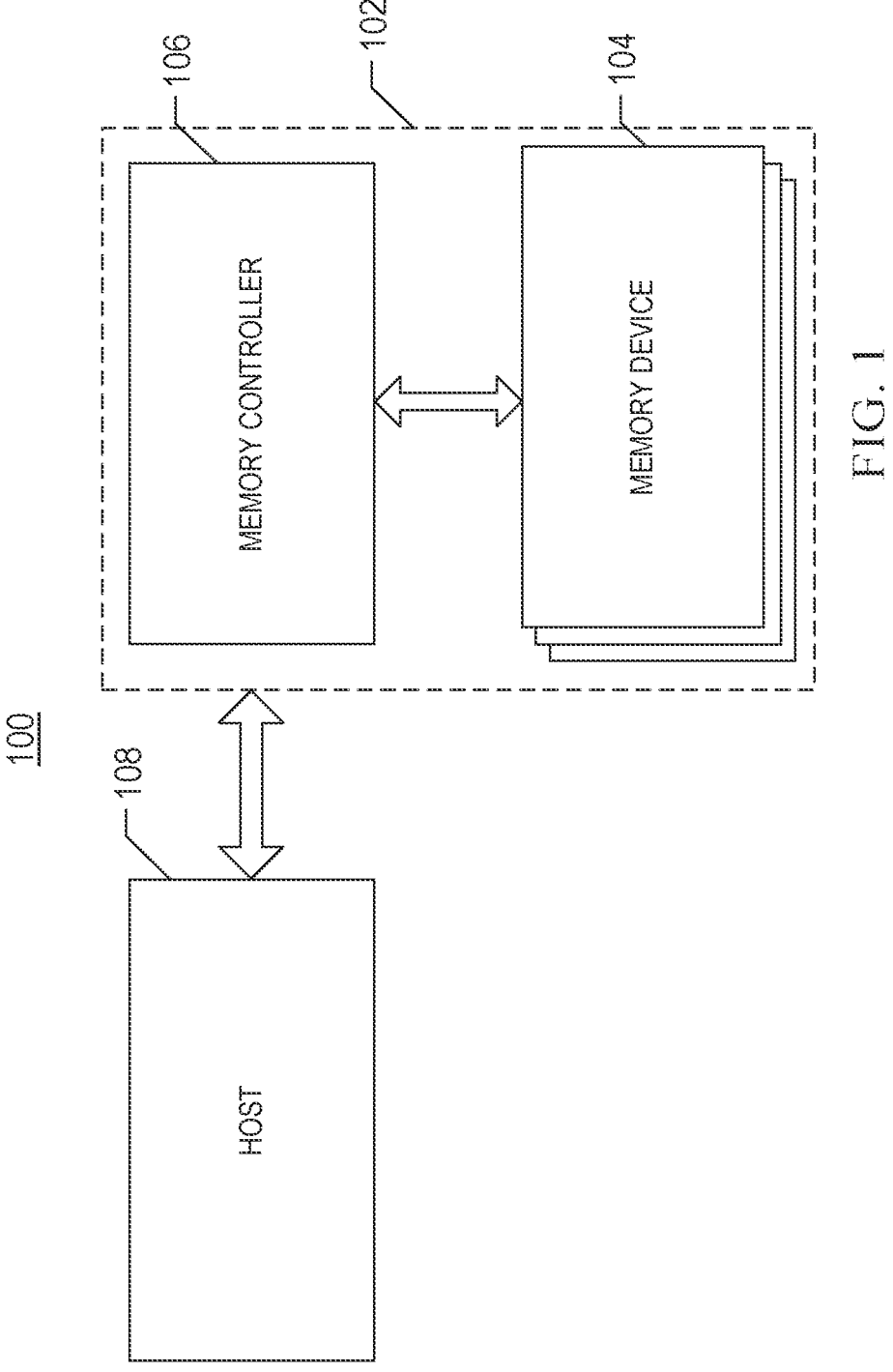
FIG. 1 is a schematic diagram of an example system having a memory system provided by an example of the present application.

FIG. 1 shows a block diagram of an example system having a memory system. In FIG. 1, the system 100 may be a mobile phone, a desktop computer, a laptop computer, a tablet computer, a vehicle computer, a gaming console, a printer, a positioning device, a wearable electronic device, a smart sensor, a Virtual Reality (VR) device, an Augmented Reality (AR) device, or any other suitable electronic devices having storage therein. As shown in FIG. 1, the system 100 may comprise a host 108 and a memory system 102, wherein the memory system 102 has one or more memory devices 104 and a memory controller 106. The host 108 may be a central processing unit (CPU) or a graphics processing unit (GPU). The host 108 may be configured to send or receive data to or from the memory device 104 through the memory controller.

The memory controller is coupled to the memory device 104 and the host 108, and is configured to control the memory device 104. The memory controller may manage the data stored in the memory device 104 and communicate with the host 108.

The memory controller may be configured to control operations of the memory device 104, such as read, erase, write, and refresh operations. In some examples, the memory controller may further perform any other suitable functions as well, for example, formatting the memory device 104. The memory controller may communicate with an external device (e.g., the host 108) according to a particular communication protocol.

In some examples, the one or more memory devices 104 and the memory controller may all be integrated into various types of storages, for example, the plurality of memory devices 104 may be integrated into a memory module, and the memory controller may be integrated into a northbridge of a mainboard or directly integrated into the CPU. That is to say, the memory system 102 may be implemented and packaged into different types of end electronic products.

Figure 2:
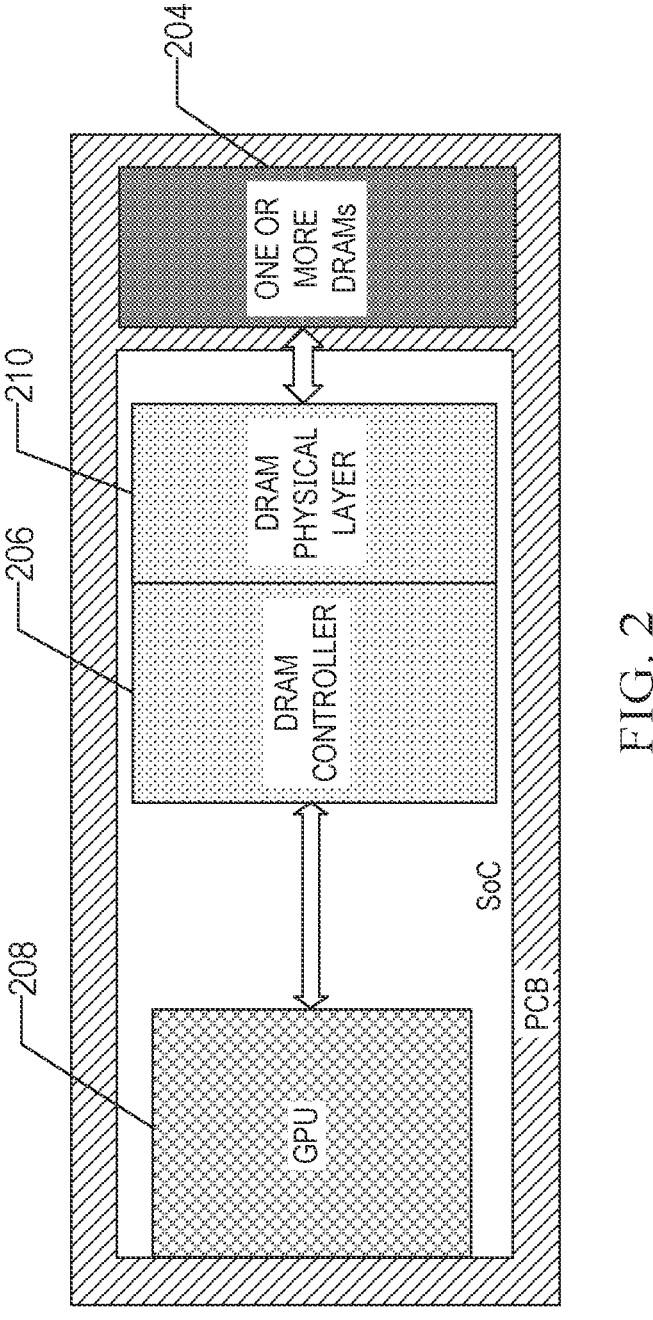
FIG. 2 is a schematic diagram of an example electronic device having a memory system provided by an example of the present application.

In a system example shown in FIG. 2, the system comprises a System on Chip (SoC) and one or more memory devices, wherein the memory device comprises a DRAM 204, and the SoC comprises a graphics processing unit (GPU) 208, a DRAM controller 206, and a DRAM physical layer 210. The DRAM controller 206 is responsible for scheduling of read and write instructions and the timing control of the DRAM 204, and the DRAM physical layer 210 is responsible for encoding the scheduled instructions according to requirements of the DRAM 204, transmitting corresponding write data to the DRAM 204, and receiving data read from the DRAM 204. PCB stands for Printed Circuit Board.

Figure 3:
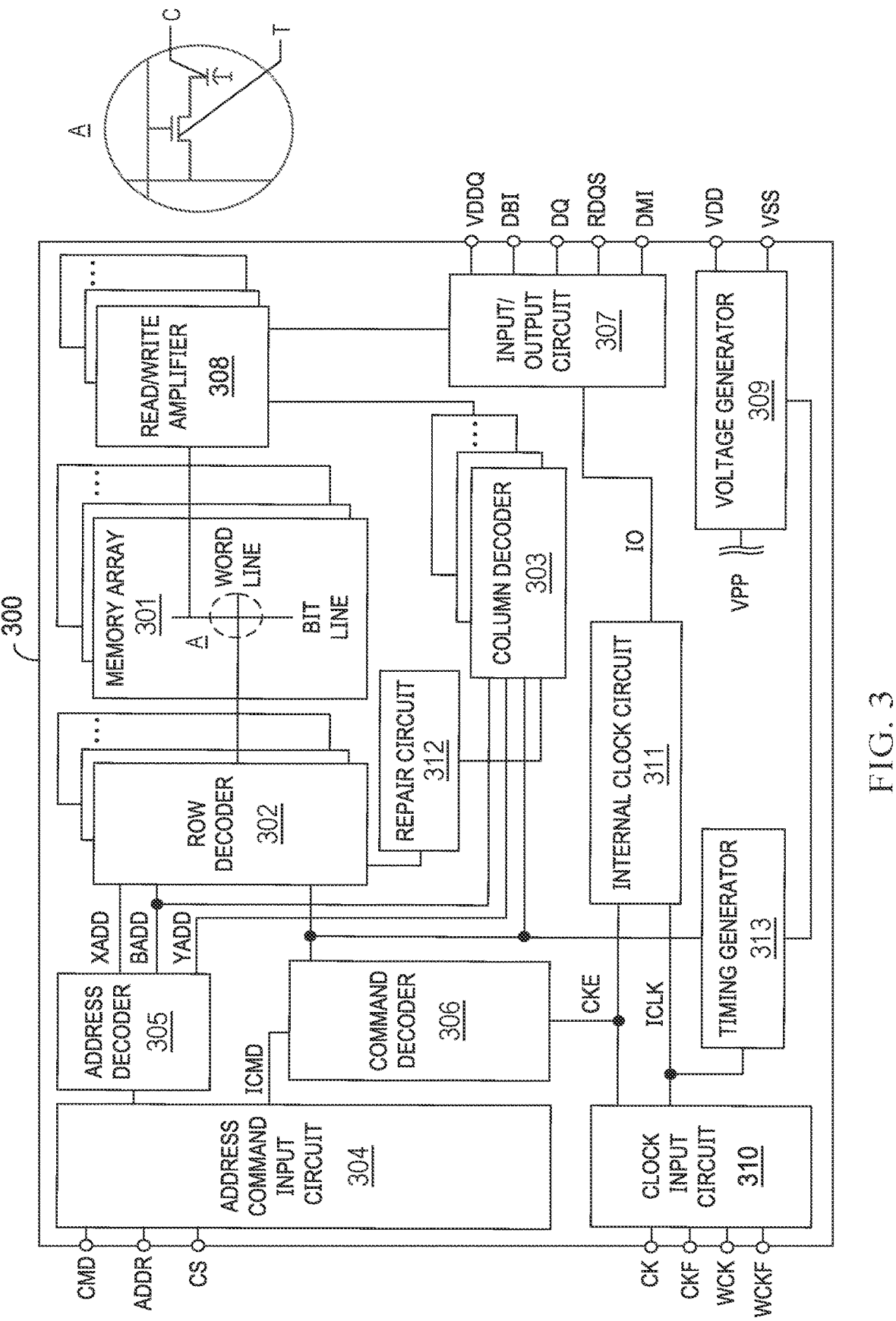
FIG. 3 is a first block diagram of an example memory device provided by an example of the present application.

FIG. 3 is a block diagram of a memory device 300 provided by an example of the present application. The memory device may comprise a three-dimensional integrated (3DI) device or a semiconductor die assembly stacked and packaged by dice, for example, the memory device 300 may comprise the DRAM of one or more dice/chips or a portion thereof. In FIG. 3, the memory device 300 may comprise an array of storing data, for example, a memory array 301. The memory array 301 may comprise a plurality of memory planes (for example, memory planes 0 to 15), and each memory plane may comprise a plurality of memory blocks (Block or called a memory bank), wherein each memory block comprises a plurality of memory cell rows and a plurality of memory cell columns, each memory cell row is coupled to one corresponding word line, and each memory cell column is coupled to one corresponding bit line. A memory cell may comprise any one of several different types (for example, comprising capacitive, magnetoresistive, ferroelectric, phase-transition, etc.), for example, the memory cell comprises: one transistor T and one capacitor C, and a major action principle is to represent whether one binary bit is 1 or 0 using an amount of charge stored in the capacitor. The memory device 300 may employ a plurality of external terminals, which comprise a command terminal and an address terminal coupled to a command bus and an address bus respectively to receive a command signal (CMD) and an address signal (ADDR). The memory device 300 may further comprise a chip selection terminal for receiving a chip selection signal (CS), a clock terminal for receiving clock signals CK and CKF, a data clock terminal for receiving data clock signals WCK and WCKF, data terminals DQ, RDQS, DBI, and DMI, and power supply terminals VDD, VSS, and VDDQ. The command terminal and the address terminal may supply the address signal and a plane address signal from outside (not shown in FIG. 3). The address signal and the plane address signal supplied to the address terminal may be transferred to an address decoder 302 via a command/address input circuit 304. The address decoder 302 may receive the address signal, and supply a decoded row address signal (XADD) to a row decoder 240, and supply a decoded column address signal (YADD) to a column decoder 303. The address decoder 302 may also receive a memory plane address signal and supply the memory plane address signal to both the row decoder 240 and the column decoder 303.

The command terminal and the address terminal may supply the command signal (CMD), the address signal (ADDR), and the chip selection signal (CS) from at least one of the memory controller or a nefarious chipset. The command signal may represent various memory commands (for example, comprising an access command that may comprise a read command and a write command) from the memory controller. The chip selection signal may be used for selecting the memory device 300 to respond to commands and addresses provided to the command terminal and the address terminal. When a valid chip selection signal is provided to the memory device 300, the commands and the addresses may be decoded, and memory operations may be performed. The command signal may be provided, as an internal command signal ICMD, to a command decoder 306 via the command/address input circuit 304. The command decoder 306 may comprise a circuit used for decoding the internal command signal ICMD to generate various internal signals and commands (for example, a row command signal used to select a word line and a column command signal used to select a bit line) for performing the memory operations. The command decoder 306 may further comprise one or more registers for tracking various counts or values (for example, a refresh command received by the memory device 300 or counts of self-refresh operations performed by the memory device 300). Data may be read from memory cells designated by a row address (such as an address having a valid command) and a column address (such as an address having a read command) in the memory array 301. The read command may be received by the command decoder 306, said command decoder may provide an internal command to an input/output circuit 307, such that read data may be output from the data terminals DQ, RDQS, DBI, and DMI according to an RDQS clock signal via a read/write amplifier 308 and the input/output circuit 307. The read data may be provided at a time defined by read delay information RL programmed in the memory device 300, for example, in a mode register (not shown in FIG. 3). The read delay information RL may be defined according to a clock cycle of a CK clock signal. For example, when the associated read data is provided, the read delay information RL may be several clock cycles of the CK signal after the memory device 300 receives the read command. Write data may be supplied to the data terminals DQ, DBI, and DMI according to the WCK and WCKF clock signals. The write command may be received by the command decoder 306, and the command decoder provides the internal command to the input/output circuit 307, such that the write data may be received by a data receiver in the input/output circuit 307 and supplied to the memory array 301 via the input/output circuit 307 and the read/write amplifier (or a sensing amplification circuit) 308. The write data may be written into the memory cells designated by the row address and the column address. The write data may be provided to the data terminal at a time defined by write delay WL information. The write delay WL information may be programmed in the memory device 300, for example, in the mode register. The write delay WL information may be defined according to the clock cycle of the CK clock signal. For example, when the associated write data is received, the write delay WL information may be several clock cycles of the CK signal after the memory device 300 receives the write command. The power supply terminal may supply power supply potentials VDD and VSS. These power supply potentials VDD and VSS may be supplied to an internal voltage generator circuit 309. The internal voltage generator circuit 309 may generate various internal potentials VPP based on the power supply potentials VDD and VSS, wherein the internal potentials VPP may be used in the row decoder 240. The power supply terminal may also supply a power supply potential VDDQ. The power supply potential VDDQ and the power supply potential VSS may be supplied to the input/output circuit 307 together. In some examples of the technology of the present application, the power supply potential VDDQ may be a potential same as the power supply potential VDD. In some examples of the technology of the present application, the power supply potential VDDQ may be a potential different from the power supply potential VDD. However, the dedicated power supply potential VDDQ may be used for the input/output circuit 307 such that power supply noise produced by the input/output circuit 307 is not propagated to other circuit blocks. The clock terminal and the data clock terminal may supply an external clock signal and a complementary external clock signal. The external clock signals CK, CKF, WCK, and WCKF may be supplied to a clock input circuit 310. The CK and CKF signals may be complementary, and the WCK and WCKF signals may be also complementary. The complementary clock signals may have opposite clock levels and simultaneously convert between the opposite clock levels. For example, when the clock signal is at a low clock level, the complementary clock signal is at a high level, and when the clock signal is at a high clock level, the complementary clock signal is at a low clock level. Furthermore, when the clock signal is converted from the low clock level to the high clock level, the complementary clock signal is converted from the high clock level to the low clock level, and when the clock signal is converted from the high clock level to the low clock level, the complementary clock signal is converted from the low clock level to the high clock level. An input buffer comprised in the clock input circuit 310 may receive the external clock signal. For example, when a clock/enable signal from the command decoder 306 is enabled, the input buffer may receive the clock/enable signal. The clock input circuit 310 may receive the external clock signal to generate an internal clock signal ICLK. The internal clock signal ICLK may be supplied to an internal clock circuit 311. The internal clock circuit 311 may provide various phases and frequency-controlled internal clock signals based on the received internal clock signal ICLK from the command/address input circuit 304 and the clock/enable signal (not shown in FIG. 3). For example, the internal clock circuit 311 may comprise a clock path (not shown in FIG. 3) that receives the internal clock signal ICLK and provides various clock signals to the command decoder 306. The internal clock circuit 311 may further provide an input/output (IO) clock signal. The IO clock signal may be supplied to the input/output circuit 307, and may be used as a timing signal to determine output timing of the read data and/or input timing of the write data. The IO clock signals may be provided at a plurality of clock frequencies, such that data may be output from the memory device 300 or the data may be input to the memory device 300 at different data rates. When a higher memory speed is expected, a higher clock frequency may be expected. When lower power consumption is expected, a lower clock frequency may be expected. The internal clock signal ICLK may be also supplied to a timing generator 313 such that various internal clock signals may be generated. The memory device 300 may be connected to any one of several electronic devices that can use a memory for the temporary or permanent storage of information, or components thereof. For example, a host device of the memory device 300 may be a computing device, such as a desktop or portable computer, a server, a hand-held device (such as a mobile phone, a tablet computer, a digital reader, or a digital media player), or some components thereof (such as a central processing unit, a co-processor, a dedicated memory controller, etc.). The host device may be any one of a networking device (such as a switch, a router, and the like) or a recorder for at least one of digital images, audio or videos, a vehicle, an electrical appliance, a toy or several other products. In one example, the host device may be directly connected to the memory device 300, although in other examples, the host device may be indirectly connected to the memory device (for example, via a network connection or via an intermediary device). The memory device 300 may comprise a repair circuit 312 that may be coupled to one or more address decoders such as at least one of the address decoder 302, the row decoder 240, or the column decoder 303. The repair circuit 312 may be configured to repair defects in the memory cells. For example, the repair circuit 312 may use the redundant memory cell rows in the memory array 301 to replace the defective memory cell rows. In some examples, circuits (such as the row decoder 240, the column decoder 303, the address decoder 302, the repair circuit 312, etc.) comprised in the memory device 300 other than the memory array 301 may be collectively referred to as a peripheral circuit.

In a row redundancy system of the memory system of the DRAM described above, some redundant memory cell rows are disposed in the memory array, and these redundant memory cell rows are used to replace the defective memory cell rows for data storage. In a normal operation flow of the memory device, the command/address input circuit 304 comprised in the memory device shown in FIG. 3 accesses address information indicating the memory cell row and an operation command, the address information of the memory cell row is obtained by the address decoder and the operation command is obtained by the command decoder, such that operations related to the operation command are performed on the memory cells comprised in the memory cell row indicated by the address information. However, during actual operations, the memory cell row indicated by the address information may be defective (e.g., a situation in which the memory cell row does not function properly, such as short circuit occurs in the word line between neighboring memory cell rows or open circuit occurs in the word line of the memory cell row, etc.). When this situation occurs, decoding and charging (driving) of the defective memory cell row is stopped, in turn the redundant memory cell row replacing the defective memory cell row is charged (driven). In this case, since the redundant memory cell row replacing the defective memory cell row further needs to be driven on the basis of driving of the normal memory cell row, the speed of data storage using the redundant memory cell row is slower than the speed of data storage using the normal memory cell row (i.e., the memory cell row without defects), affecting the programming speed.

Figure 4:
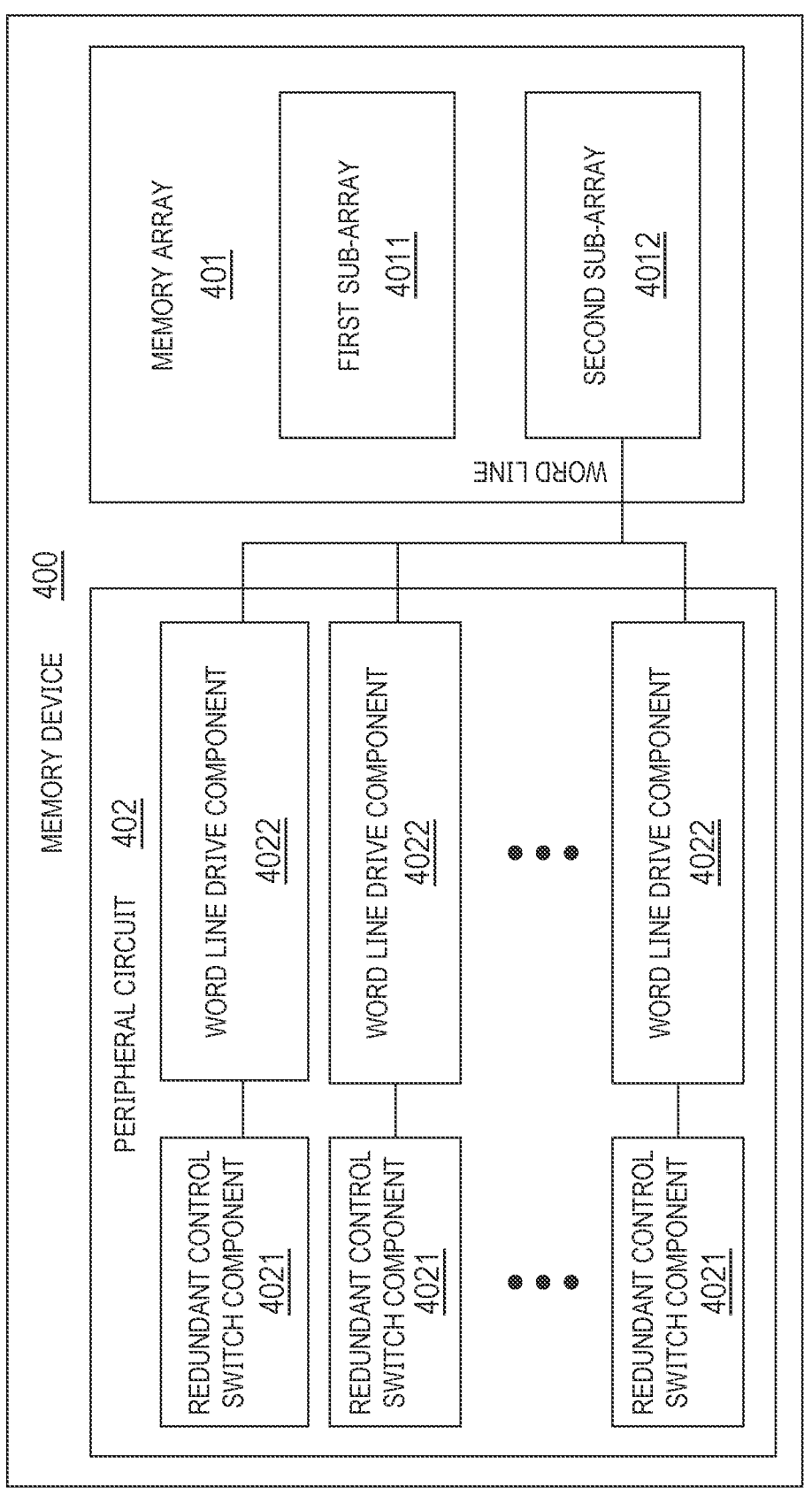
FIG. 4 is a second block diagram of an example memory device provided by an example of the present application.

In order to solve one or more of the above technical problems, as shown in FIG. 4, examples of the present application provide a memory device 400. In FIG. 4, the memory device 400 may comprise a memory array 401 comprising a first sub-array 4011 and a second sub-array 4012, wherein the first sub-array 4011 comprises a plurality of first memory cell rows, and the second sub-array 4012 comprises a plurality of second memory cell rows; and a peripheral circuit 402 coupled to the plurality of first memory cell rows and the plurality of second memory cell rows and comprising: a plurality of redundant control switch components 4021 coupled to the plurality of second memory cell rows one-to-one; and a word line drive component 4022 coupled to each of the plurality of redundant control switch components, wherein each of the redundant control switch components 4021 is configured to: in response to a first redundant selection signal, be in an on state and transmit a corresponding redundant control signal to a corresponding word line drive component 4022, wherein the first redundant selection signal is generated when a first memory cell row indicated by input address information is determined to be faulty; and the corresponding word line drive component 4022 is configured to: in response to the redundant control signal, drive a second memory cell row of the plurality of second memory cell rows that is configured to replace the first memory cell row indicated by the input address information.

The plurality of first memory cell rows comprised in the first sub-array may be memory cell rows that is first selected to be operated in an operation flow of the memory device. The plurality of second memory cell rows comprised in the second sub-array are redundant memory cell rows, and only when there is a defect in the first memory cell row to be operated, the redundant memory cell row replaces the defective first memory cell row for operation. The number of the first memory cell rows comprised in the first sub-array is greater than the number of the second memory cell rows comprised in the second sub-array. The above description of the first memory cell row and the second memory cell row also means that, in a certain operation flow of the memory device, for example, in a write operation flow, the memory device parses the input address information, and drives the first memory cell row indicated by the input address information (charges a word line of the first memory cell row) for data storage. Meanwhile, the memory device also determines, according to the input address information, whether there is a defect in the first memory cell row indicated by the input address information. If there is a defect in the first memory cell row indicated by the input address information, the memory device also finds the second memory cell row to replace the first memory cell row, and drives the corresponding second memory cell row to replace the defective first memory cell row (stopping the charging of the word line of the defective first memory cell row, and charging a word line of the second memory cell row that replaces the first memory cell row) for data storage.

For the above operation flow, the repair circuit 312 needs to perform a series of encoding and decoding operations to generate the redundant control signal that drives the word line drive component of the second memory cell row, causing the memory device to be slow in responding to the operation command, thus greatly affecting the speed of the memory device. Based on this, in the examples of the present application, the plurality of redundant control switch components coupled to the plurality of second memory cell rows one-to-one are disposed in the peripheral circuit 402, such that the redundant control signal is directly transmitted into the corresponding word line drive component using the redundant control switch component, so as to drive the corresponding second memory cell row, thereby achieving rapid driving of the second memory cell row. Through such design, the speed for driving the second memory cell row may be greatly increased to increase the overall speed, and electric leakage caused by the decoding of a decoding circuit (such as a row decoder, a column decoder, and the like) may be removed as well. More particularly, in some examples, the redundant control switch component may be disposed in the repair circuit 312 as shown in FIG. 3.

Here, the first redundant selection signal is generated when the first memory cell row indicated by the input address information is determined to be faulty. In other words, the repair circuit 312 in the memory device generates the first redundant selection signal when determining the first memory cell row indicated by the input address information to be faulty according to some judgments. In practical applications, the corresponding redundant control switch component is in an on state under the action of the first redundant selection signal, and directly transmits the redundant control signal to the corresponding word line drive component, such that the word line of the second memory cell row that replaces the faulty first memory cell row is directly charged for later use. The input address information may be transmitted to the memory device by the memory controller as shown in FIG. 1, a write command carrying the input address information is accessed by the address command input circuit in the memory device as shown in FIG. 3, the input address information is obtained by the address decoder, and the write command is obtained by the command decoder, for later use. Here, the input address information may be used for indicating one first memory cell row, that is to say, the memory controller transmits the write command carrying the input address information to the memory device via the address command input circuit. Then, the input address information is obtained by the address decoder in the memory device, the write command is obtained by the command decoder in the memory device, and after that, the repair circuit determines that the first memory cell row indicated by the input address information is defective according to the input address information and generates the first redundant selection signal. Then, under the action of the first redundant selection signal, the redundant control switch component is in the on state, and directly transmits the redundant control signal to the corresponding word line drive component, such that the word line of the second memory cell row that replaces the faulty first memory cell row is directly charged for later use.

In some examples, each redundant control switch component 4021 may be further configured to: in response to a second redundant selection signal, be in an off state and inhibit transmitting the redundant control signal to the corresponding word line drive component.

The redundant control switch component is in the off state under the control of the second redundant selection signal, and inhibits transmitting the redundant control signal to the corresponding word line drive component, wherein the second redundant selection signal is generated when the first memory cell row indicated by the input address information is determined to be fault-free. That is to say, the repair circuit in the memory device generates the second redundant selection signal when the first memory cell row indicated by the input address information is determined to be fault-free, and the redundant control switch component is in the off state under the action of the second redundant selection signal. At this time, the transmission of the redundant control signal to the corresponding word line drive component is inhibited, such that the redundant memory cell rows do not need to be enabled, but the first memory cell row is directly used for data storage.

The above describes two working states of the redundant control switch component, and at the same time, each redundant control switch component works in a certain working state, that is, the redundant control switch component is in the on state in response to the first redundant selection signal or in the off state in response to the second redundant selection signal. Moreover, when the redundant control switch component is in the on state, the redundant control signal is directly transmitted to the corresponding word line drive component to drive the second memory cell row that replaces the first memory cell row. And when the redundant control switch component is in the off state, the transmission of the redundant control signal to the corresponding word line drive component is inhibited.

In some examples, the redundant control signal is obtained according to a decoding table comprising a mapping relationship between a redundant replacement scheme stored in the memory device and the redundant control signal, and the redundant replacement scheme comprises indication information indicating the second memory cell row which is configured to replace the first memory cell row that is faulty.

The decoding table may comprise a preset corresponding relationship between the redundant control signal and address information of the second memory cell row. Then, the redundant control signal corresponding to each redundant control switch component may be obtained from the decoding table, and is fixed and known. For example, the redundant control signal comprises 7 bits, and there are 128 redundant control switch components, each redundant control switch component transmits one redundant control signal. For example, a certain redundant control switch component transmits a redundant control signal 0000000 under the action of the first redundant selection signal, but when the redundant control switch component accesses the second redundant selection signal, the transmission of the redundant control signal 0000000 is inhibited. For another example, another redundant control switch component transmits a redundant control signal 0000010 under the action of the first redundant selection signal, but when the redundant control switch component accesses the second redundant selection signal, the transmission of the redundant control signal 0000010 is inhibited.

Here, the first redundant selection signal may be at a logic high level (i.e., 1), and in this case, the second redundant selection signal may be at a logic low level (i.e., 0). Alternatively, the first redundant selection signal may be at the logic low level, and in this case, the second redundant selection signal may be at the logic high level. In practice, the logic high level may comprise a power supply voltage VDD comprised in the memory device. The logic low level may comprise a ground voltage VSS comprised in the memory device.

Figure 5:
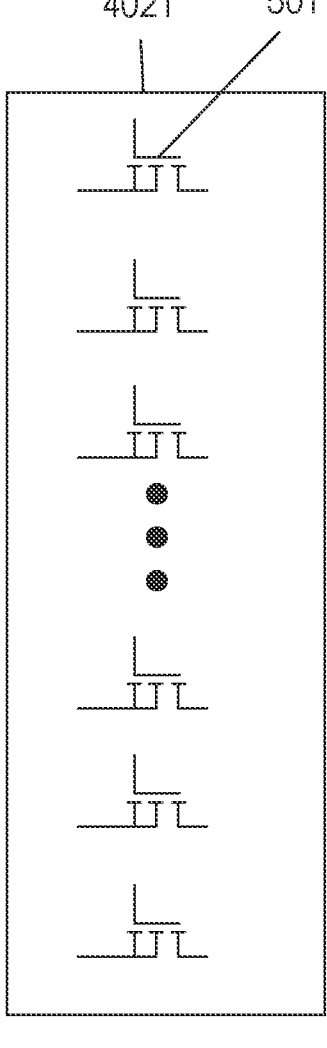
FIG. 5 is a schematic structural diagram of an example redundant control switch component provided by an example of the present application.

In some examples, the redundant control signal may comprise a plurality of bits, and as shown in FIG. 5, the redundant control switch component may comprise a plurality of switch circuits 501 corresponding to the plurality of bits one-to-one, wherein each of the plurality of switch circuits is of the same type, wherein each switch circuit 501 is configured to: in response to the first redundant selection signal, be in the on state and transmit a corresponding bit in the redundant control signal to the corresponding word line drive component; or in response to the second redundant selection signal, be in the off state and inhibit transmitting the corresponding bit in the redundant control signal to the corresponding word line drive component.

The switch circuit may comprise: an N-type metal oxide semiconductor NMOS transistor or a P-type metal oxide semiconductor PMOS transistor.

The redundant control signal may comprise the plurality of bits, and in this case, a plurality of switch circuits are required to transmit the plurality of bits to the corresponding word line drive component bit by bit. In an example, the redundant control switch component comprises the plurality of switch circuits corresponding to the plurality of bits one-to-one, wherein each of the plurality of switch circuits is of the same type, for example, the switch circuits may be the NMOS transistors or the PMOS transistors. In this structure, each switch circuit is in an on state under the action of the first redundant selection signal, and directly transmits the bit connected with the switch circuit to the corresponding word line drive component; and each switch circuit is in an off state under the action of the second redundant selection signal, and inhibits transmitting the bit connected with the switch circuit to the corresponding word line drive component. The first redundant selection signal is generated when the first memory cell row indicated by the input address information has a defect, and in this case, the redundant second memory cell row is required to replace the defective first memory cell row; and the second redundant selection signal is generated when the first memory cell row indicated by the input address information has no defect, and in this case, the redundant second memory cell row is not required to replace the defective first memory cell row.

In some examples, when each of the above-mentioned switch circuits is the NMOS transistor, the first redundant selection signal is at the logic high level, and the second redundant selection signal is at the logic low level. In other examples, when each of the above-mentioned switch circuits is the PMOS transistor, the first redundant selection signal is at the logic low level, and the second redundant selection signal is at the logic high level.

For example, the redundant control signal comprises 7 bits. In this case, the number of the switch circuits is 7. All the switch circuits may be the NMOS transistors or the PMOS transistors. In addition, when each switch circuit is turned on by receiving the first redundant selection signal, each bit in the redundant control signal is transmitted to the corresponding word line drive component, so as to drive the corresponding second memory cell row. The numbers described here, such as the 7 bits comprised in the redundant control signal, the number of the switch circuits being 7, etc., are merely examples, and are not limitations.

Figure 6:
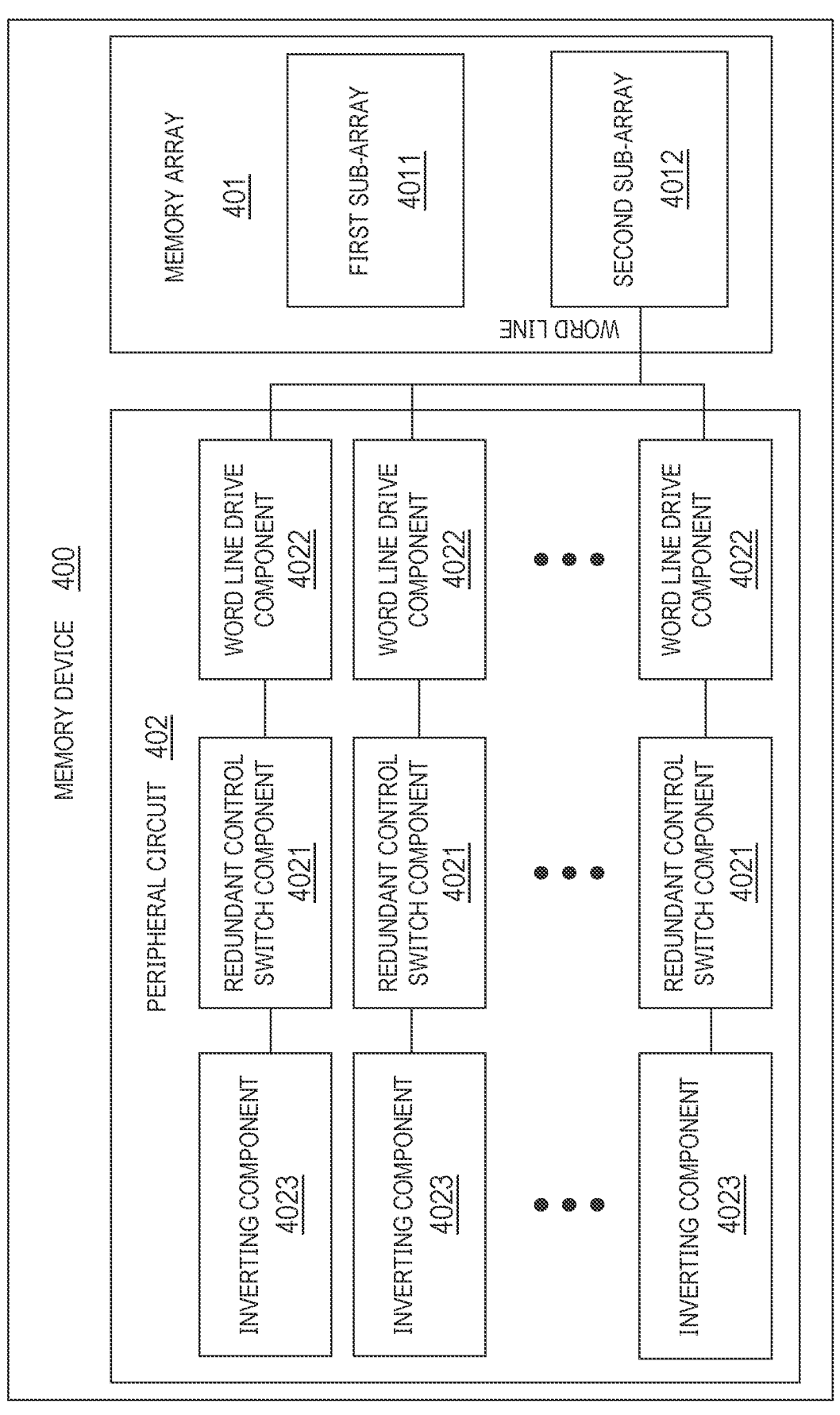
FIG. 6 is a third block diagram of an example memory device provided by an example of the present application.

In some other examples, as shown in FIG. 6, the peripheral circuit 402 may further comprise an inverting component 4023 coupled to each of the plurality of redundant control switch components;

each inverting component 4023 is configured to output a first inverting signal in response to the first redundant selection signal; or output a second inverting signal in response to the second redundant selection signal; and the each of the redundant control switch components 4021 is further configured to: be in the on state in response to the first redundant selection signal and the first inverting signal; or be in the off state in response to the second redundant selection signal and the second inverting signal.

In this structure, the redundant control switch component is controlled by two signals jointly, that is, under the action of the first redundant selection signal and the first inverting signal, the redundant control switch component is in the on state to transmit the redundant control signal to the corresponding word line drive component, such that the word line drive component drives the corresponding second memory cell row to replace the defective first memory cell row; and under the action of the second redundant selection signal and the second inverting signal, the redundant control switch component is in the off state to inhibit transmitting the redundant control signal to the corresponding word line drive component, that is, decoding may be performed normally without enabling the redundant memory cell row. Here, the first inverting signal is the same as the second redundant selection signal; and the second inverting signal is the same as the first redundant selection signal.

Based on the memory device as shown in FIG. 6, the redundant control signal may comprise the plurality of bits; as shown in FIG. 7, the redundant control switch component may comprise a plurality of switch circuits corresponding to the plurality of bits one-to-one, wherein the plurality of switch circuits comprise two types of switch circuits, wherein a first type of switch circuit 701 of the plurality of switch circuits is configured to: in response to the first redundant selection signal, be in the on state and transmit a corresponding bit of the plurality of bits; and a second type of switch circuit 702 of the plurality of switch circuits is configured to: in response to the first inverting signal, be in the on state and transmit the corresponding bit of the plurality of bits.

Furthermore, the first type of switch circuit is further configured to: in response to the second redundant selection signal, be in the off state and inhibit transmitting the corresponding bit of the plurality of bits, and the second type of switch circuit is further configured to: in response to the second inverting signal, inhibit transmitting the corresponding bit of the plurality of bits.

Here, the first type of switch circuit comprises an NMOS transistor, and the second type of switch circuit comprises a PMOS transistor; or the first type of switch circuit comprises a PMOS transistor, and the second type of switch circuit comprises an NMOS transistor.

That is to say, when the redundant control switch component comprises two types of switch circuits, whether the redundant control switch component is turned on is controlled by two signals. The switch circuit comprises the first type of switch circuit and the second type of switch circuit; here, the first type of switch circuit is in the on state under the action of the first redundant selection signal, and directly transmits the bits connected with the first type of switch circuit to the corresponding word line drive component; the second type of switch circuit is in the on state under the action of the first inverting signal, and transmits the bits connected with the second type of switch circuits to the corresponding word line drive component. On the other hand, the first type of switch circuit is in the off state under the action of the second redundant selection signal, and inhibits transmitting the bits connected with the first type of switch circuit to the corresponding word line drive component; and the second type of switch circuit is in the off state under the action of the second inverting signal, and inhibits transmitting the bits connected with the second type of switch circuit to the corresponding word line drive component.

In an example, the redundant control switch component comprises a plurality of first type of switch circuits and a plurality of second type of switch circuits, which is determined according to the transmitted redundant control signal and the habits of a designer.

Figure 8:
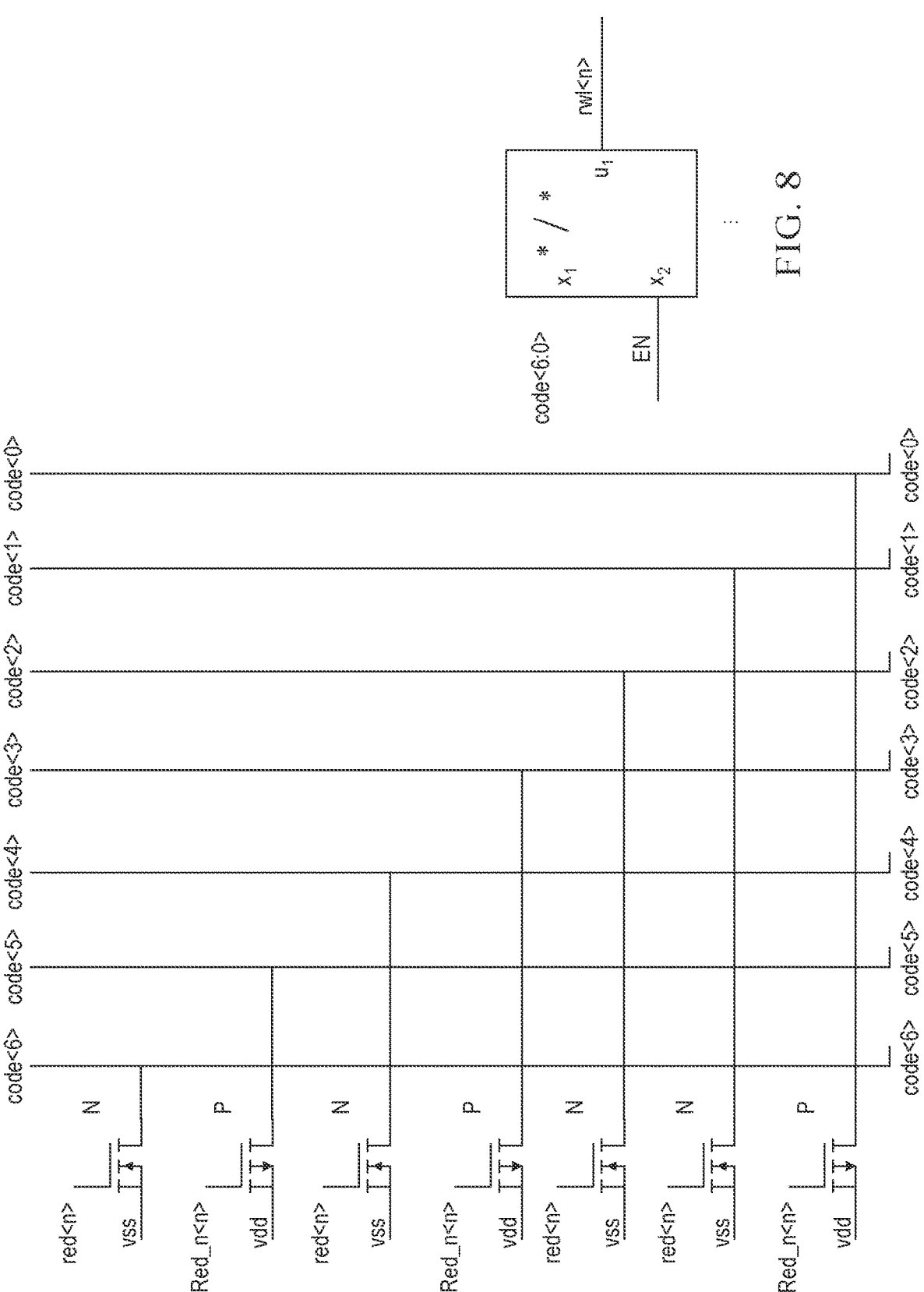
FIG. 8 is a flow diagram of an operation method of a memory device for the redundant control switch component shown in FIG. 7 provided by an example of the present application.

For example, when the redundant control signal code<6: 0> to be transmitted is 0101001, the corresponding redundant control switch component comprises 7 switch circuits. Corresponding to this situation, a design manner is as shown in FIG. 8. In FIG. 8, the redundant control switch component comprises 7 switch circuits, wherein there are 4 switch circuits of the first type, and the first type of switch circuits comprise the NMOS transistors; there are 3 switch circuits of the second type; and the second type of switch circuits comprise the PMOS transistors. In addition, vss represents "0" in the redundant control signal, and vdd represents "1" in the redundant control signal. Based on this, in the redundant control switch component shown in FIG. 8, when the first type of switch circuits access the first redundant selection signal red<n> and the second type of switch circuits access the first inverting signal Red_n<n>, each bit in the redundant control signal 0101001 is directly transmitted to the corresponding word line drive component by a first transmission bus described below. Furthermore, when the first type of switch circuits access the second redundant selection signal Red_n<n> and the second type of switch circuits access the second inverting signal red<n>, the transmission of each bit in the redundant control signal 0101001 to the corresponding word line drive component is inhibited.

In an example, another design manner is shown in FIG. 9, the redundant control switch component comprises 7 switch circuits, wherein there are 3 switch circuits of the first type, and the first type of switch circuits comprise the NMOS transistors; there are 4 switch circuits of the second type, and the second type of switch circuits comprise the PMOS transistors. Based on this, in the redundant control switch component shown in FIG. 9, when the first type of switch circuits access the first redundant selection signal red<n> and the second type of switch circuits access the first inverting signal Red_n<n>, each bit in the redundant control signal 0101001 is directly transmitted to the corresponding word line drive component by a first transmission bus described below. Furthermore, when the first type of switch circuits access the second redundant selection signal Red_n<n> and the second type of switch circuits access the second inverting signal red<n>, the transmission of each bit in the redundant control signal 0101001 to the corresponding word line drive component is inhibited.

For example, as shown in FIG. 10, when the redundant control switch component numbered 0 of the plurality of redundant control switch components accesses the second redundant selection signal Red_n<0>, the transmission of the corresponding bit "1" in the corresponding redundant control signal is inhibited. When the redundant control switch component numbered 127 of the plurality of redundant control switch components accesses the first redundant selection signal red<127>, the transmission of the corresponding bit "0" in the corresponding redundant control signal is allowed. ax_rra<0> represents a first bit code<0> of the received redundant control signal.

In some examples, as shown in FIG. 11, the peripheral circuit 402 may further comprise a plurality of redundant selection components 4024 corresponding to the plurality of redundant control switch components one-to-one, wherein each of the redundant selection components 4024 is configured to: receive the input address information; compare the input address information with preset address information; output the first redundant selection signal in response to a comparison result indicating that the preset address information is the same as the input address information; and output the second redundant selection signal in response to the comparison result indicating that the preset address information is different from the input address information, wherein the preset address information comprises any one of address information corresponding to the plurality of second memory cell rows.

The redundant selection component 4024 may comprise a content addressable memory CAM configured to store the preset address information; and the CAM is further configured to: receive the input address information; compare each bit in the input address information with each bit of the preset address information; output the first redundant selection signal in response to each bit in the input address information being the same as each bit of the preset address information; and output the second redundant selection signal in response to the input address information and the preset address information having bits that are different.

The preset address information described here may be address information of any one of the plurality of second memory cell rows, and may be also address information of the second memory cell row replaced corresponding to the defective first memory cell row. The process described above comprises: receiving, by the redundant selection component, the input address information, and comparing the input address information with the preset address information, wherein the first redundant selection signal is output when a comparison result indicates that the preset address information is the same as the input address information; and the second redundant selection signal is output when the comparison result indicates that the preset address information is different from the input address information.

In an example, the redundant selection component may be the content-addressable memory (CAM). In an example, the input address information comprises the plurality of bits, for example, 15 bits. Based on this, the redundant selection component described above compares the input address information with the preset address information. In an example, the CAM may compare the input address information with the preset address information bit by bit, wherein the first redundant selection signal is output when the comparison result indicates that each bit in the input address information is the same as each bit of the preset address information; and the second redundant selection signal is output when the comparison result indicates that the input address information and the preset address information have bits that are different.

In some examples, the peripheral circuit may further comprise a first transmission bus coupled to the plurality of redundant control switch components and the plurality of word line drive components respectively and configured to receive the redundant control signal transmitted by the redundant control switch component in the on state and transmit the redundant control signal to the corresponding word line drive component.

Here, the number of transmission lines comprised in the first transmission bus is the same as the number of bits comprised in the redundant control signal.

In some examples, the peripheral circuit may further comprise a second transmission bus coupled to the plurality of redundant selection components and configured to: receive the input address information and transmit the input address information to each of the redundant selection components.

The first transmission bus is a transmission bus that connects the redundant control switch component and the word line drive component. The second transmission bus is a bus that transmits the input address information to the redundant selection component.

In the memory device provided by the examples of the present application, by disposing the redundant control switch components coupled to the plurality of second memory cell rows one-to-one, the redundant control switch component is turned on in response to the first redundant selection signal, and directly transmits the redundant control signal to the corresponding word line drive component, such that the corresponding second memory cell row is driven to rapidly replace the defective first memory cell row for data storage; or the redundant control switch component is turned off in response to the second redundant selection signal, and inhibits transmitting the redundant control signal to the correspondingly-connected word line drive component and uses the normal first memory cell row for data storage.

In order to understand the present application, as shown in FIG. 12, a particular schematic structural diagram of a repair circuit 312 in a memory device provided by examples of the present application is shown. In FIG. 12, the memory device 1200 comprises a second transmission bus 1201, a plurality of redundant selection components 1202, a plurality of inverting components 1203, a plurality of redundant control switch components 1204, a first transmission bus 1205, and a plurality of word line drive components 1206, wherein the second transmission bus 1201 accesses input address information input_address<14:0>, and the accessed input address information is transmitted to each of the redundant selection components 1202; each of the redundant selection components 1202 compares the input address information with corresponding preset address information latch_data_n<14:0>, and generates a first redundant selection signal or a second redundant selection signal red<n>, wherein when each bit of the input address information is the same as each bit of the corresponding preset address information, the first redundant selection signal red<n> is generated; and when the input address information and the corresponding preset address information have bits that are different, the second redundant selection signal red<n> is generated. Then, the first redundant selection signal or the second redundant selection signal is transmitted to the corresponding inverting components 1203 thereof to respectively generate red_n<0>-red_n<127> as a plurality of first inverting signals or second inverting signals red_n<n>; then, the redundant control switch components switches<n>1204 are in an on state under the action of the first redundant selection signals and the first inverting signals, and directly transmit the redundant control signals code<6:0> to the corresponding word line drive components 1206 by the first transmission bus 1205, such that the corresponding second memory cell rows are driven to replace the defective first memory cell rows. The number of the redundant selection components, inverting components, redundant control switch components, and word line drive components is the same as the number of the second memory cell rows comprised in the memory device. For examples, as shown in FIG. 12, the redundant control switch components comprise switches<0>-switches<127>, i.e., 128 in total, wherein each of the redundant control switch components is connected with a word line coupled to one second memory cell row; when a certain redundant control switch component accesses the first redundant selection signal and the first inverting signal, the corresponding redundant control signal code is directly transmitted to the corresponding word line drive component 1206 by the first transmission bus to drive the word line of the corresponding second memory cell row for later use.

The redundant control switch component described above may comprise transistors of the same type, or may comprise a combination of two types of transistors. In an actual application process, if the redundant control switch component comprises transistors of the same type, the redundant control switch component may also comprise two types of transistors. In an example, the design is performed according to actual situations, which is no longer repeated herein.

As shown in FIG. 13, examples of the present application further provide an operation method of a memory device, which may comprise:

Operation 1301: in response to a first memory cell row comprised in the memory device indicated by an input address signal being determined to be faulty, generating a first redundant selection signal;

Operation 1302: in response to the first redundant selection signal, causing a corresponding redundant control switch component in the memory device to be in an on state and transmit a corresponding redundant control signal to a corresponding word line drive component in the memory device; and Operation 1303: in response to the redundant control signal, causing the word line drive component to drive a second memory cell row in the memory device that is configured to replace the first memory cell row.

In some examples, the method further comprises:
in response to the first memory cell row being determined to be fault-free, generating a second redundant selection signal; and
in response to the second redundant selection signal, causing the corresponding redundant control switch component in the memory device to be in an off state and inhibit transmitting the corresponding redundant control signal to the corresponding word line drive component in the memory device, wherein the second redundant selection signal is generated when the first memory cell row indicated by the input address information is determined to be fault-free.

In some examples, the method further comprises:
generating a first inverting signal in response to the first redundant selection signal; and in response to the first redundant selection signal and the first inverting signal, causing the corresponding redundant control switch component in the memory device to be in the on state and transmit the corresponding redundant control signal to the corresponding word line drive component in the memory device;
or
generating a second inverting signal in response to the second redundant selection signal; and in response to the second redundant selection signal and the second inverting signal, causing the corresponding redundant control switch component in the memory device to be in the off state and inhibit transmitting the corresponding redundant control signal to the corresponding word line drive component in the memory device.

In some examples, the method further comprises:
comparing the input address information with preset address information;
generating the first redundant selection signal in response to a comparison result indicating that the preset address information is the same as the input address information; and
generating the second redundant selection signal in response to the comparison result indicating that the preset address information is different from the input address information,
wherein the preset address information comprises any one of address information corresponding to a plurality of second memory cell rows, and each of the plurality of second memory cell rows is configured to perform redundant replacement on the first memory cell row that is faulty.

In some examples, the comparing the input address information with preset address information comprises: comparing each bit in the input address information with each bit of the preset address information, wherein the first redundant selection signal is generated in response to each bit in the input address information being the same as each bit of the preset address information, and the second redundant selection signal is generated in response to the input address information and the preset address information having bits that are different.

In some examples, the redundant control signal is obtained according to a decoding table comprising a mapping relationship between a redundant replacement scheme stored in the memory device and the redundant control signal, and the redundant replacement scheme comprises indication information indicating the second memory cell row which is configured to replace the first memory cell row that is faulty.

The operation method of the memory device provided by the examples of the present application belongs to the same inventive concept as the memory device provided by the preceding examples of the present application. Features here have been described above in detail, which are no longer repeated herein.

Examples of the present application further provide a memory system, comprising at least one memory device described above, and a memory controller coupled to the memory device and configured to control the memory device.

For the memory controller described above, for example, as shown in FIG. 14, it shows a schematic diagram of a hardware structure of a memory controller provided in the present application. The memory controller 1400 comprises at least one processor 1401, a memory 1402, and at least one communication interface 1403, wherein various components in the memory controller are coupled together by a bus system 1404, and it can be understood that, the bus system 1404 is configured to enable connection and communication among these components. In addition to a data bus, the bus system 1404 further comprises a power supply bus, a control bus, and a state signal bus. However, for the sake of clear illustration, various buses in FIG. 14 are labeled as the bus systems 1404.

The memory controller may further comprise other storage structures, and these storage structures are collectively known as memory. The memory may comprise a volatile memory or a non-volatile memory, and may also comprise both the volatile memory and the non-volatile memory. The non-volatile memory may comprise a Read Only Memory (ROM), a Programmable Read-Only Memory (PROM), an Erasable Programmable Read-Only Memory (EPROM), an Electrically Erasable Programmable Read-Only Memory (EEPROM), a Ferromagnetic Random Access Memory (FRAM), a Flash Memory, a magnetic surface memory, an optical disk, or a Compact Disc Read-Only Memory (CD-ROM); and the magnetic surface memory may comprise a magnetic disk memory or a magnetic tape memory. The volatile memory may comprise a Random Access Memory (RAM), which is used as an external cache. By way of illustration, but not limitation, many forms of RAM are available, such as a Static Random Access Memory (SRAM), a Synchronous Static Random Access Memory (SSRAM), a Dynamic Random Access Memory (DRAM), a Synchronous Dynamic Random Access Memory (SDRAM), a Double Data Rate Synchronous Dynamic Random Access Memory (DDRSDRAM), an Enhanced Synchronous Dynamic Random Access Memory (ESDRAM), a SyncLink Dynamic Random Access Memory (SLDRAM), and a Direct Rambus Random Access Memory (DRRAM). The memory 1402 described in the examples of the present application is intended to include, but not limited to, these and any other suitable types of memories.

The memory 1402 in the examples of the present application is configured to store various types of data to support operations of the memory controller. Examples of the data comprise any computer program used to operate on the memory controller, for example, firmware of the memory controller may be included in the memory 1402.

The method disclosed in the above examples of the present application may be applied to the processor 1401, or implemented by the processor 1401. The processor may be an integrated circuit chip, which has the capability of processing signals. During implementation, various operations of the above-mentioned method may be completed by an integrated logic circuit of hardware in the processor or instructions in a form of software. The above-mentioned processor may be a general-purpose processor, a Digital Signal Processor (DSP), or other programmable logic devices, discrete gate or transistor logic devices, discrete hardware components, and the like. The processor may implement or perform the methods, operations, and logic block diagrams disclosed in the examples of the present application. The general-purpose processor may comprise a microprocessor or any conventional processor, etc. The operations of the method disclosed in conjunction with the examples of the present application may be directly embodied as being performed by a hardware decoding processor, or performed with a combination of hardware and software modules in a decoding processor. The software module may be located in a storage medium, wherein the storage medium is located in the memory, the processor reads information in the memory, and the operations of the above-mentioned method are performed in conjunction with hardware thereof.

In an example, the memory controller may be implemented by one or more Application Specific Integrated Circuits (ASIC), a DSP, a Programmable Logic Device (PLD), a Complex Programmable Logic Device (CPLD), a Field-Programmable Gate Array (FPGA), a general-purpose processor, a controller, a Micro Controller Unit (MCU), a microprocessor, or other electronic elements to perform the above-mentioned method.

In several examples provided by the present application, it should be understood that the disclosed device and method may be implemented in other ways. The device examples as described above are only illustrative, for example, the division of the units is only a logical functional division. In an actual implementation, there may be another way for division. For instance, a plurality of units or components may be combined, or may be integrated in another system, or some features can be ignored or not performed. In addition, the coupling or direct coupling or communication connection between various constituent parts as shown or as discussed may be implemented through indirect coupling or communication connection of some interfaces, devices or units, and may be electrical, mechanical or in other forms.

The above-mentioned units described as separate components may or may not be physically separated. The components shown as units may or may not be physical units, that is, they may be located in one place, or may be distributed onto a plurality of network units. According to actual needs, part or all of the units may be selected for realizing the purposes of the scheme of the example.

In addition, various functional units in each example of the present application may be all integrated into one processing unit, or each unit may serve as one unit individually, or two or more units may be integrated into one unit. The above-mentioned integrated unit may be implemented in a form of hardware or in a form of hardware and software functional units.

Those of ordinary skill in the art may understand that all or part of the operations of the above-mentioned method examples may be completed by a program instruction related hardware. A computer-readable storage medium may store the aforementioned program that, when executed, the operations including the above-mentioned method examples are performed. The aforementioned storage medium includes various media that can store program codes, such as a mobile storage device, a Read-Only Memory (ROM), a Random Access Memory (RAM), a magnetic disk, or an optical disk, or the like.

Alternatively, the above integrated unit of the present application, if being implemented in a form of a software functional module and serving as an individual product for sales or use, may also be stored in a computer readable storage medium. Based on such understanding, the technical solutions of the examples of the present application may be essentially embodied in a form of a software product, or a portion contributing to the prior art may be embodied in a form of a software product. The computer software product is stored in a storage medium, including several instructions to cause a computer device (which may be a personal computer, a server, or a network device, or the like) to execute all or part of the method of various examples of the present application. The aforementioned storage medium includes media that can store program code, such as a mobile storage device, a ROM, a RAM, a magnetic disk, or an optical disk, or the like.

Examples of the present application further provide a computer system, comprising the above-mentioned memory system, and a graphics processing unit coupled to the memory system and configured to control the memory system.

In some examples, the graphics processing unit and the memory system are integrated on the same printed circuit board.

In an example, as shown in FIG. 2, the graphics processing unit and the memory controller in the memory system are integrated in the same die, and the die and the memory device are integrated on the same printed circuit board.

The computer system belongs to the same inventive concept as the preceding memory device and operation method. The computer system comprises the above-mentioned memory device or memory system, and in different computer system structures, the graphics processing unit and the memory device are integrated on the same PCB, or the graphics processing unit and the memory controller are integrated on the same PCB. Accordingly, the terms appearing herein have been explained in detail above and are equally applicable here, which are no longer repeated here. Only the structures most relevant to the technical solutions of the present application are described herein. The computer system provided in the present application may further comprise structures and descriptions of the system shown in FIG. 1. The computer system further comprises structures not shown but required for the normal working of an electronic device, which are no longer repeated here in the present application in view of the length of the application document.

The above descriptions are only examples of the present application, and are not used to limit the protection scope of the present application.

What is claimed is:

1. A memory device, comprising:
a memory array comprising a first sub-array and a second sub-array, wherein the first sub-array comprises a plurality of first memory cell rows, and the second sub-array comprises a plurality of second memory cell rows; and
a peripheral circuit coupled to the plurality of first memory cell rows and the plurality of second memory cell rows and comprising:
   a plurality of redundant control switch components coupled to the plurality of second memory cell rows one-to-one; and
   a word line drive component coupled to each of the plurality of redundant control switch components, wherein
   each of the redundant control switch components is configured to: in response to a first redundant selection signal, be in an on state and transmit a corresponding redundant control signal to a corresponding word line drive component, wherein the first redundant selection signal is generated when a first memory cell row indicated by input address information is determined to be faulty; and
   the corresponding word line drive component is configured to: in response to the redundant control signal, drive a second memory cell row of the plurality of second memory cell rows that is configured to replace the first memory cell row indicated by the input address information.

2. The memory device of claim 1, wherein each of the redundant control switch components is further configured to: in response to a second redundant selection signal, be in an off state and inhibit transmitting the redundant control signal to the corresponding word line drive component, wherein the second redundant selection signal is generated when the first memory cell row indicated by the input address information is determined to be fault-free.

3. The memory device of claim 2, wherein the peripheral circuit further comprises:
an inverting component coupled to each of the plurality of redundant control switch components, wherein
each inverting component is configured to:
   output a first inverting signal in response to the first redundant selection signal; and
   output a second inverting signal in response to the second redundant selection signal; and
the each of the redundant control switch components is further configured to:
   be in the on state in response to the first redundant selection signal and the first inverting signal; and
   be in the off state in response to the second redundant selection signal and the second inverting signal.

4. The memory device of claim 3, wherein the redundant control signal comprises a plurality of bits, and the redundant control switch component comprises:
a plurality of switch circuits corresponding to the plurality of bits one-to-one, wherein the plurality of switch circuits comprise two types of switch circuits, and wherein
a first type of switch circuit of the plurality of switch circuits is configured to:
   in response to the first redundant selection signal, be in the on state and transmit a corresponding bit of the plurality of bits; and
a second type of switch circuit of the plurality of switch circuits is configured to:

in response to the first inverting signal, be in the on state and transmit the corresponding bit of the plurality of bits.

5. The memory device of claim 4, wherein
the first type of switch circuit is further configured to:
    in response to the second redundant selection signal, be in the off state and inhibit transmitting the corresponding bit of the plurality of bits, and
the second type of switch circuit is further configured to:
    in response to the second inverting signal, inhibit transmitting the corresponding bit of the plurality of bits.

6. The memory device of claim 5, wherein the first and second types of switch circuits are different, and wherein the first type of switch circuit comprises one of an NMOS transistor and a PMOS transistor, and the second type of switch circuit comprises one of a PMOS transistor and an NMOS transistor.

7. The memory device of claim 2, wherein the redundant control signal comprises a plurality of bits, and the redundant control switch component comprises:
    a plurality of switch circuits corresponding to the plurality of bits one-to-one, wherein each of the plurality of switch circuits is of the same type and is configured to:
        in response to the first redundant selection signal, be in the on state and transmit a corresponding bit in the redundant control signal to the corresponding word line drive component; and
        in response to the second redundant selection signal, be in the off state and inhibit transmitting the corresponding bit in the redundant control signal to the corresponding word line drive component.

8. The memory device of claim 7, wherein at least one of the plurality of switch circuits comprises one of an N-type metal oxide semiconductor NMOS transistor and a P-type metal oxide semiconductor PMOS transistor.

9. The memory device of claim 2, wherein the peripheral circuit further comprises: a plurality of redundant selection components corresponding to the plurality of redundant control switch components one-to-one, wherein
    each of the redundant selection components is configured to:
        receive the input address information;
        compare the input address information with preset address information;
        output the first redundant selection signal in response to a comparison result indicating that the preset address information is the same as the input address information; and
        output the second redundant selection signal in response to the comparison result indicating that the preset address information is different from the input address information,
        wherein the preset address information comprises any one of address information corresponding to the plurality of second memory cell rows.

10. The memory device of claim 9, wherein the redundant selection component comprises a content addressable memory (CAM), wherein the CAM is configured to:
    store the preset address information;
    receive the input address information;
    compare each bit in the input address information with each bit of the preset address information;
    output the first redundant selection signal in response to each bit in the input address information being the same as each bit of the preset address information; and output the second redundant selection signal in response to the input address information and the preset address information having bits that are different.

11. The memory device of claim 2, wherein the peripheral circuit further comprises: a first transmission bus coupled to the plurality of redundant control switch components and a plurality of word line drive components, respectively, and configured to:
    receive the redundant control signal transmitted by the redundant control switch component in the on state and transmit the redundant control signal to the corresponding word line drive component.

12. The memory device of claim 9, wherein the peripheral circuit further comprises: a second transmission bus coupled to the plurality of redundant selection components and configured to:
    receive the input address information and transmit the input address information to each of the redundant selection components.

13. An operation method of a memory device, comprising:
    in response to a first memory cell row comprised in the memory device indicated by an input address signal being determined to be faulty, generating a first redundant selection signal;
    in response to the first redundant selection signal, causing a corresponding redundant control switch component in the memory device to be in an on state and transmitting a corresponding redundant control signal to a corresponding word line drive component in the memory device; and
    in response to the redundant control signal, causing the word line drive component to drive a second memory cell row in the memory device that is configured to replace the first memory cell row.

14. The operation method of claim 13, further comprising:
in response to the first memory cell row being determined to be fault-free, generating a second redundant selection signal; and
in response to the second redundant selection signal, causing the corresponding redundant control switch component in the memory device to be in an off state and inhibit transmitting the corresponding redundant control signal to the corresponding word line drive component in the memory device, wherein the second redundant selection signal is generated when the first memory cell row indicated by input address information is determined to be fault-free.

15. The operation method of claim 14, further comprising:
generating a first inverting signal in response to the first redundant selection signal; and
in response to the first redundant selection signal and the first inverting signal, causing the corresponding redundant control switch component in the memory device to be in the on state and transmit the corresponding redundant control signal to the corresponding word line drive component in the memory device.

16. The operation method of claim 14, further comprising:
comparing the input address information with preset address information;
generating the first redundant selection signal in response to a comparison result indicating that the preset address information is the same as the input address information; and generating the second redundant selection signal in response to the comparison result indicating that the preset address information is different from the input address information, wherein the preset address information comprises any one of address information corresponding to a plurality of second memory cell rows, and each of the plurality of second memory cell rows is configured to perform redundant replacement on the first memory cell row that is faulty.

17. The operation method of claim 16, wherein the comparing the input address information with preset address information comprises:

comparing each bit in the input address information with each bit of the preset address information, wherein the first redundant selection signal is generated in response to each bit in the input address information being the same as each bit of the preset address information, and the second redundant selection signal is generated in response to the input address information and the preset address information having bits that are different.

18. The operation method of claim 13, wherein the redundant control signal is obtained according to a decoding table comprising a mapping relationship between a redundant replacement scheme stored in the memory device and the redundant control signal, and the redundant replacement scheme comprises indication information indicating the second memory cell row which is configured to replace the first memory cell row that is faulty.

19. A memory system, comprising:

at least one memory device, each of the at least one memory device comprising:

a memory array comprising a first sub-array and a second sub-array, wherein the first sub-array comprises a plurality of first memory cell rows, and the second sub-array comprises a plurality of second memory cell rows; and a peripheral circuit coupled to the plurality of first memory cell rows and the plurality of second memory cell rows and comprising:

a plurality of redundant control switch components coupled to the plurality of second memory cell rows one-to-one; and a word line drive component coupled to each of the plurality of redundant control switch components, wherein each of the redundant control switch components is configured to: in response to a first redundant selection signal, be in an on state and transmit a corresponding redundant control signal to a corresponding word line drive component, wherein the first redundant selection signal is generated when a first memory cell row indicated by input address information is determined to be faulty; and the corresponding word line drive component is configured to: in response to the redundant control signal, drive a second memory cell row of the plurality of second memory cell rows that is configured to replace the first memory cell row indicated by the input address information; and a memory controller coupled to the memory device and configured to control the memory device.

20. A computer system, comprising:

a memory system, comprising:

at least one memory device, each of the at least one memory device comprising:

a memory array comprising a first sub-array and a second sub-array, wherein the first sub-array comprises a plurality of first memory cell rows, and the second sub-array comprises a plurality of second memory cell rows; and a peripheral circuit coupled to the plurality of first memory cell rows and the plurality of second memory cell rows and comprising:

a plurality of redundant control switch components coupled to the plurality of second memory cell rows one-to-one; and a word line drive component coupled to each of the plurality of redundant control switch components, wherein each of the redundant control switch components is configured to: in response to a first redundant selection signal, be in an on state and transmit a corresponding redundant control signal to a corresponding word line drive component, wherein the first redundant selection signal is generated when a first memory cell row indicated by input address information is determined to be faulty; and the corresponding word line drive component is configured to: in response to the redundant control signal, drive a second memory cell row of the plurality of second memory cell rows that is configured to replace the first memory cell row indicated by the input address information; and a memory controller coupled to the memory device and configured to control the memory device; and a graphics processing unit coupled to the memory system and configured to control the memory system.

* * * * *